(12) United States Patent
Koyama et al.

(10) Patent No.: US 12,040,435 B2
(45) Date of Patent: Jul. 16, 2024

(54) LIGHT-EMITTING DEVICE AND IMAGE DISPLAY APPARATUS WITH REFLECTION FILM ON SIDE SURFACE AND LAYERS HAVING DIFFERENT REFRACTIVE INDICES

(71) Applicant: SONY CORPORATION, Tokyo (JP)

(72) Inventors: Takahiro Koyama, Tokyo (JP); Toyoharu Oohata, Tokyo (JP)

(73) Assignee: SONY CORPORATION, Tokyo (JP)

( * ) Notice: Subject to any disclaimer, the term of this patent is extended or adjusted under 35 U.S.C. 154(b) by 559 days.

(21) Appl. No.: 17/283,533

(22) PCT Filed: Sep. 26, 2019

(86) PCT No.: PCT/JP2019/037804
§ 371 (c)(1),
(2) Date: Apr. 7, 2021

(87) PCT Pub. No.: WO2020/080056
PCT Pub. Date: Apr. 23, 2020

(65) Prior Publication Data
US 2021/0391514 A1    Dec. 16, 2021

(30) Foreign Application Priority Data
Oct. 15, 2018    (JP) .................................. 2018-194120

(51) Int. Cl.
*H01L 33/60* (2010.01)
*H01L 25/075* (2006.01)
*H01L 33/52* (2010.01)

(52) U.S. Cl.
CPC .......... *H01L 33/60* (2013.01); *H01L 25/0753* (2013.01); *H01L 33/52* (2013.01)

(58) Field of Classification Search
CPC ...... H01L 33/60; H01L 33/52; H01L 25/0753
See application file for complete search history.

(56) References Cited

U.S. PATENT DOCUMENTS 8,378,366 B2 *   2/2013   Arndt ...................... H01L 33/56
                                                                257/E33.059
9,287,469 B2 *   3/2016   Chakraborty ........... H01L 33/56
(Continued)

FOREIGN PATENT DOCUMENTS

| CN | 101542754 A | 9/2009 |
|---|---|---|
| CN | 103026515 A | 4/2013 |

(Continued)

OTHER PUBLICATIONS

International Search Report and Written Opinion of PCT Application No. PCT/JP2019/037804, issued on Nov. 12, 2019, 11 pages of ISRWO.

(Continued)

*Primary Examiner* — Lex H Malsawma
(74) *Attorney, Agent, or Firm* — CHIP LAW GROUP

(57) ABSTRACT

Provided is a light-emitting device that includes a solid-state light source emitting excitation light and a phosphor layer having a first refractive index, provided on a light-emitting surface side of the solid-state light source, and having a first reflection film on its side surface. The light-emitting device further includes a low refractive layer provided on the phosphor layer and having a second refractive index less than the first refractive index, and a sealing member encapsulating the phosphor layer and the low refractive layer and having a third refractive index greater than or equal to the second refractive index.

19 Claims, 14 Drawing Sheets

(56) References Cited

U.S. PATENT DOCUMENTS

| | | | |
|---|---|---|---|
| 2006/0105480 A1* | 5/2006 | Boardman | H01L 33/52 257/E33.059 |
| 2009/0152582 A1* | 6/2009 | Chang | H01L 33/507 257/E33.061 |
| 2009/0278147 A1* | 11/2009 | Suzuki | H01L 33/56 257/98 |
| 2010/0067233 A1 | 3/2010 | Bechtel et al. | |
| 2010/0295076 A1* | 11/2010 | Wirth | H01L 33/58 257/98 |
| 2012/0134134 A1 | 5/2012 | Bechtel et al. | |
| 2013/0105850 A1 | 5/2013 | Komatsu et al. | |
| 2013/0140580 A1* | 6/2013 | Wirth | H01L 33/54 257/76 |
| 2018/0062052 A1* | 3/2018 | Bohmer | H01L 33/60 |

FOREIGN PATENT DOCUMENTS

| | | |
|---|---|---|
| CN | 110088923 A | 8/2019 |
| EP | 2089916 A1 | 8/2009 |
| EP | 2600427 A1 | 6/2013 |
| EP | 3507839 A1 | 7/2019 |
| JP | 2004080046 A | 3/2004 |
| JP | 2010-509751 A | 3/2010 |
| JP | 2012503860 A | 2/2012 |
| JP | 2013038353 A | 2/2013 |
| JP | 2014-052606 A | 3/2014 |
| JP | 2016-021582 A | 2/2016 |
| JP | 2017-063231 A | 3/2017 |
| JP | 2017050462 A | 3/2017 |
| JP | 2018-002492 A | 1/2018 |
| JP | 2019-530214 A | 10/2019 |
| KR | 10-2019-0042696 A | 4/2019 |
| TW | 201820661 A | 6/2018 |
| WO | 2008/056292 A1 | 5/2008 |
| WO | 2012/014360 A1 | 2/2012 |
| WO | 2012/014439 A1 | 2/2012 |
| WO | 2018/044905 A1 | 3/2018 |

OTHER PUBLICATIONS

H.-V. Han, et al., Opt. Express 23, 32504-32515 (2015).

* cited by examiner

[FIG. 1]
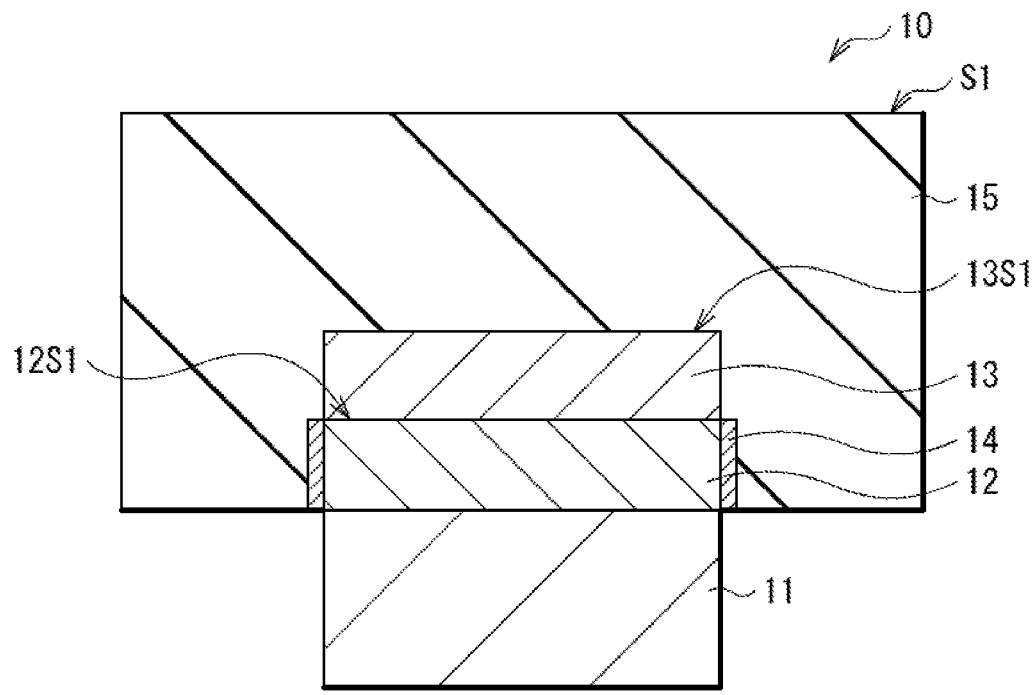
[FIG. 2]
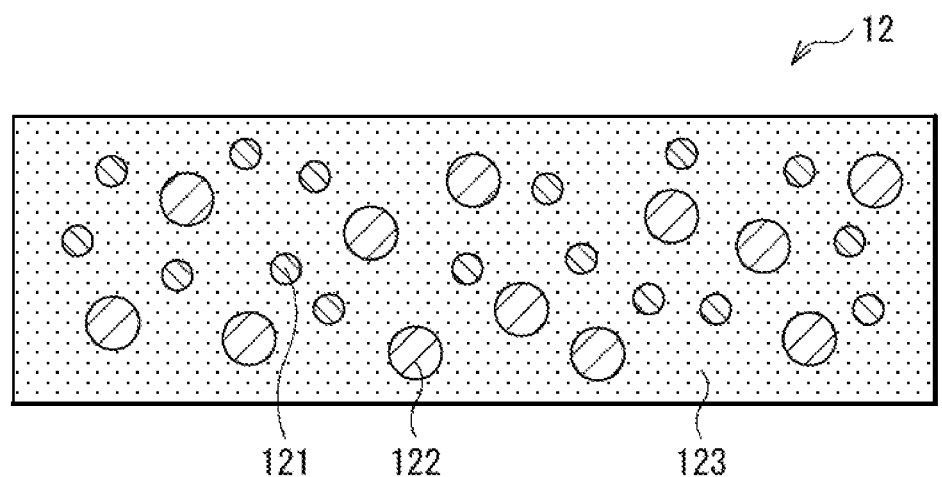

[FIG. 3]
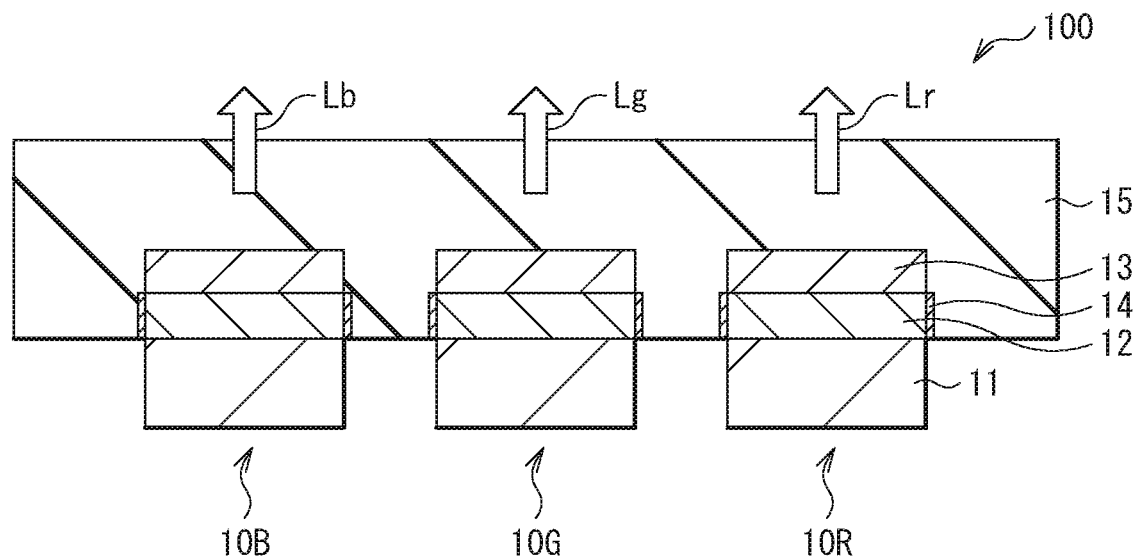
[FIG. 4]
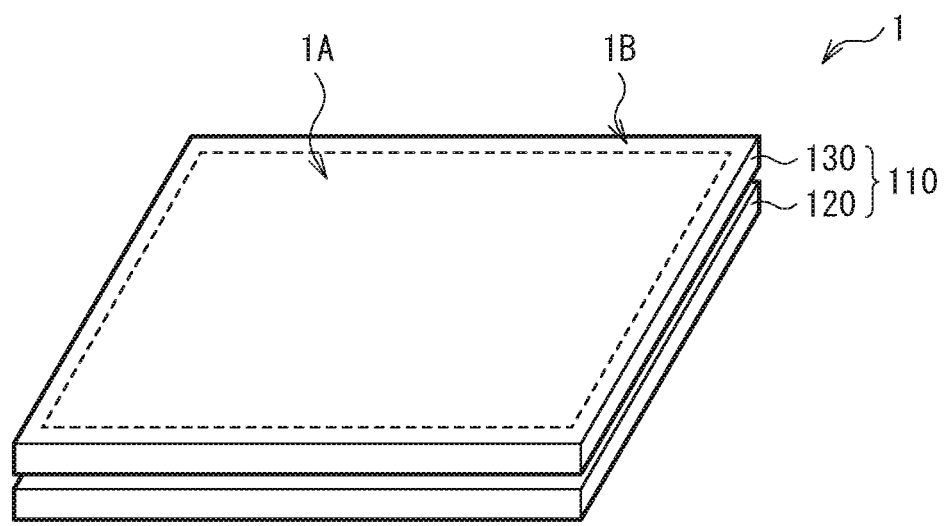

[FIG. 5]
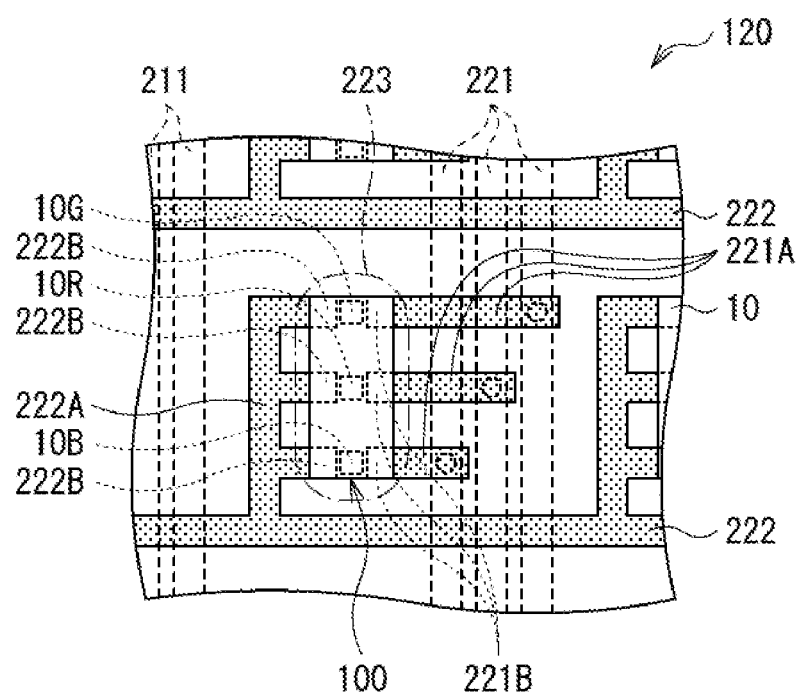

[FIG. 6]
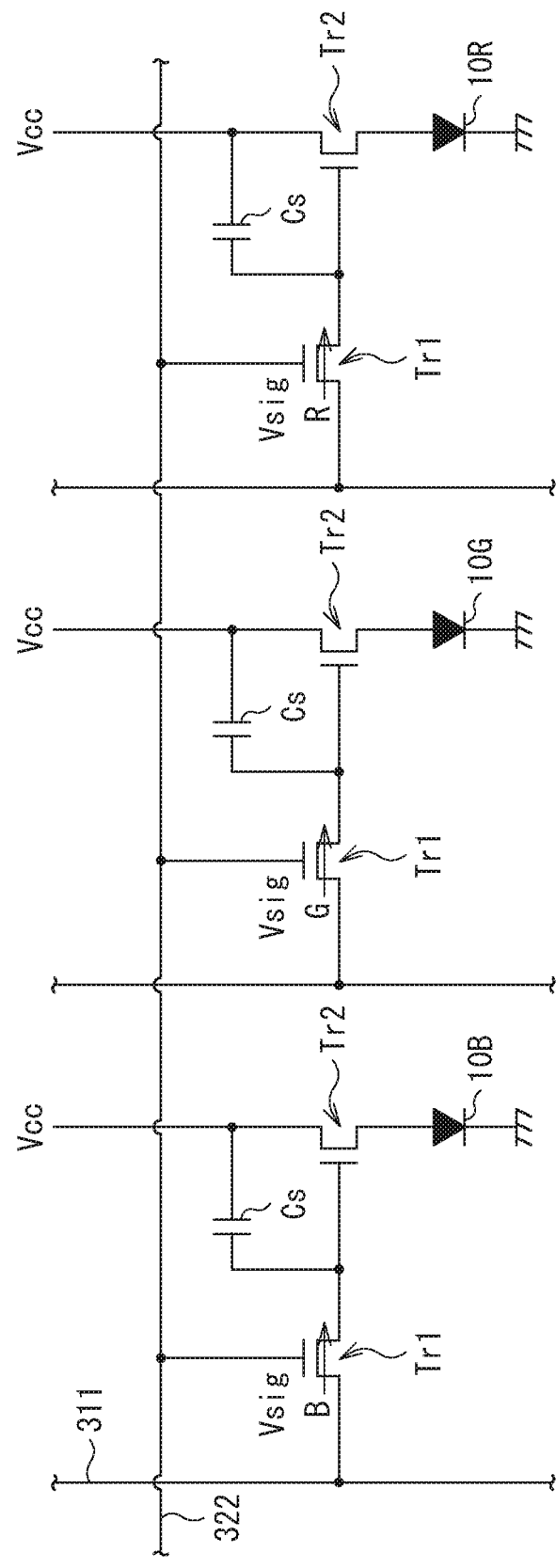

[FIG. 7]
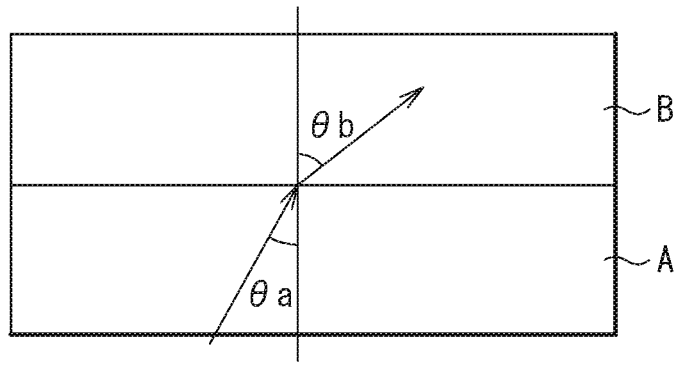
[FIG. 8]
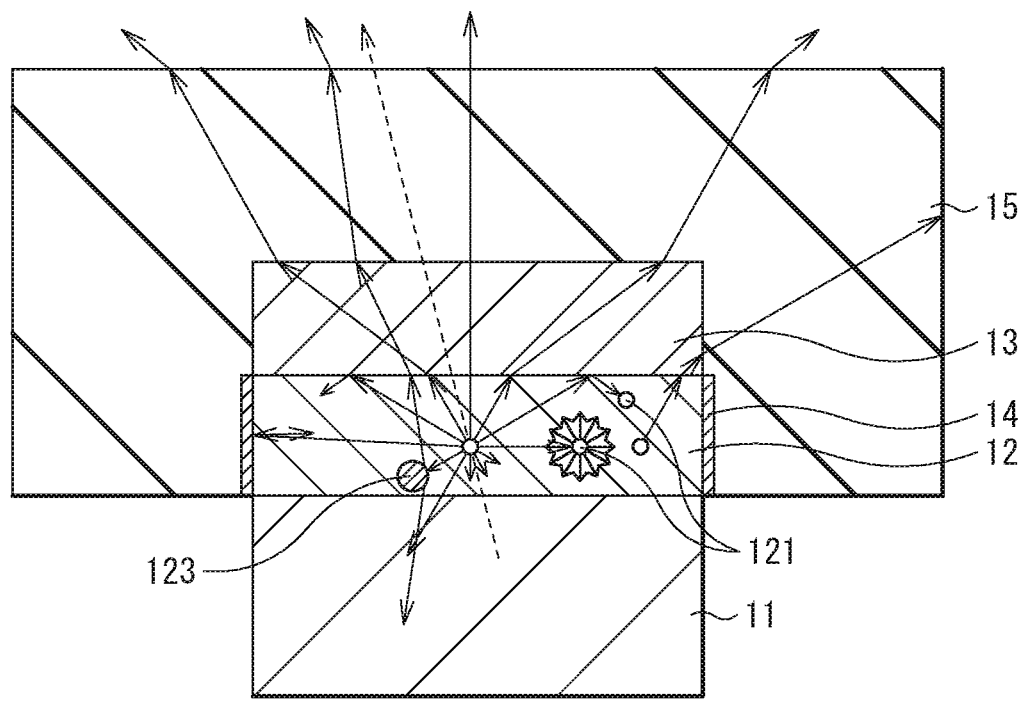

[FIG. 9]
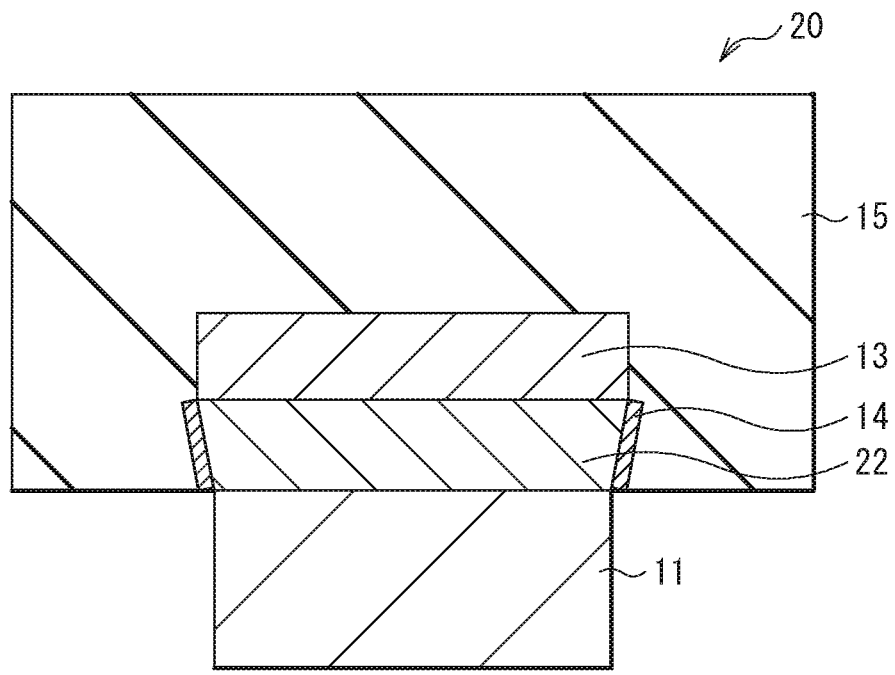
[FIG. 10]
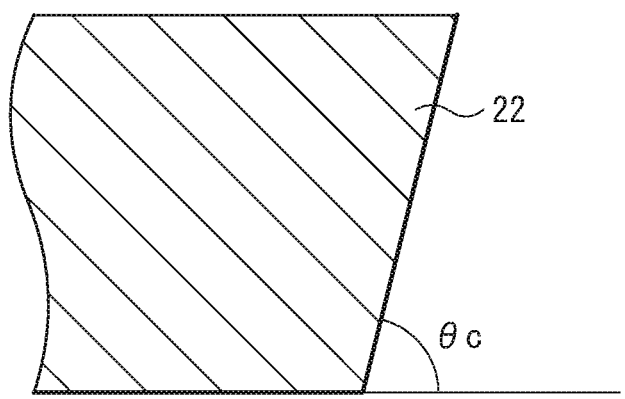

[FIG. 11]
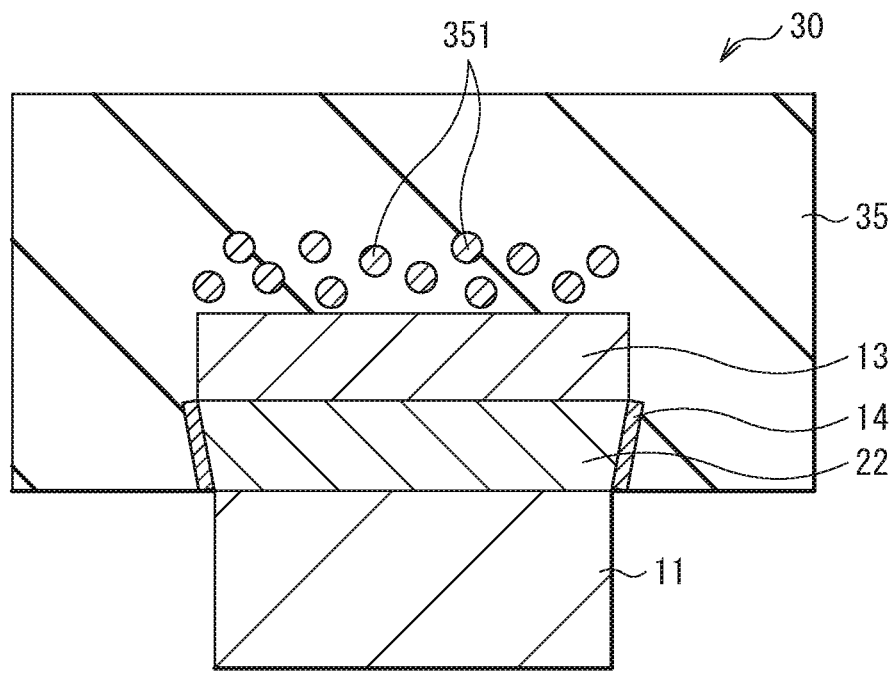
[FIG. 12]
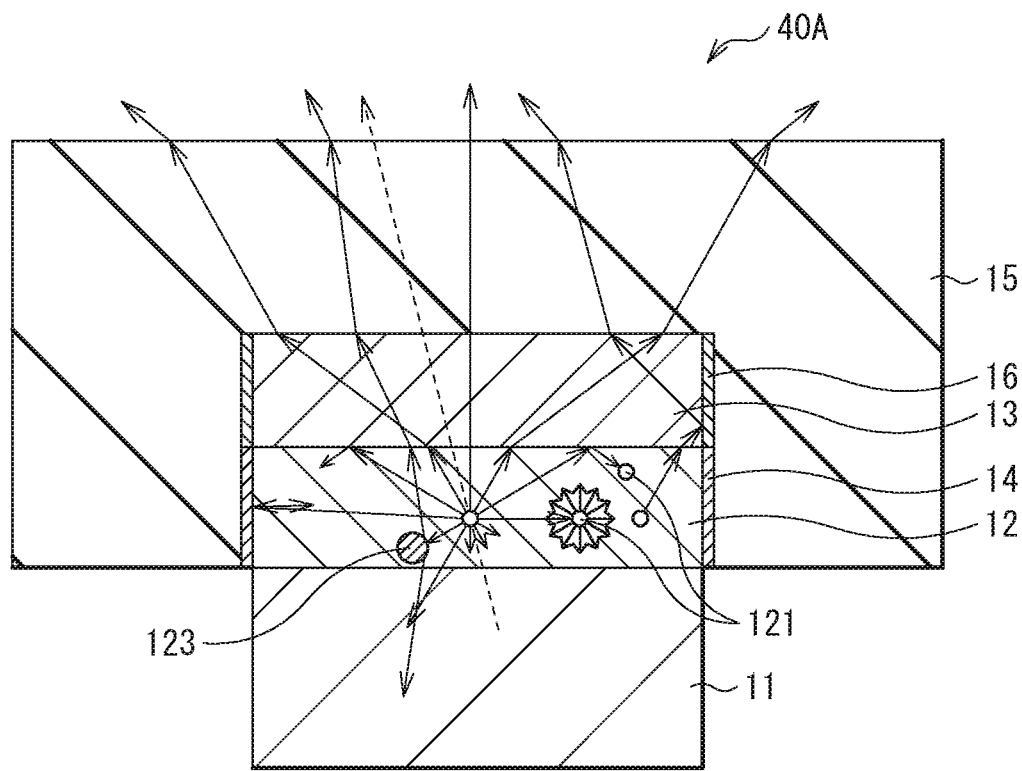

[FIG. 13]
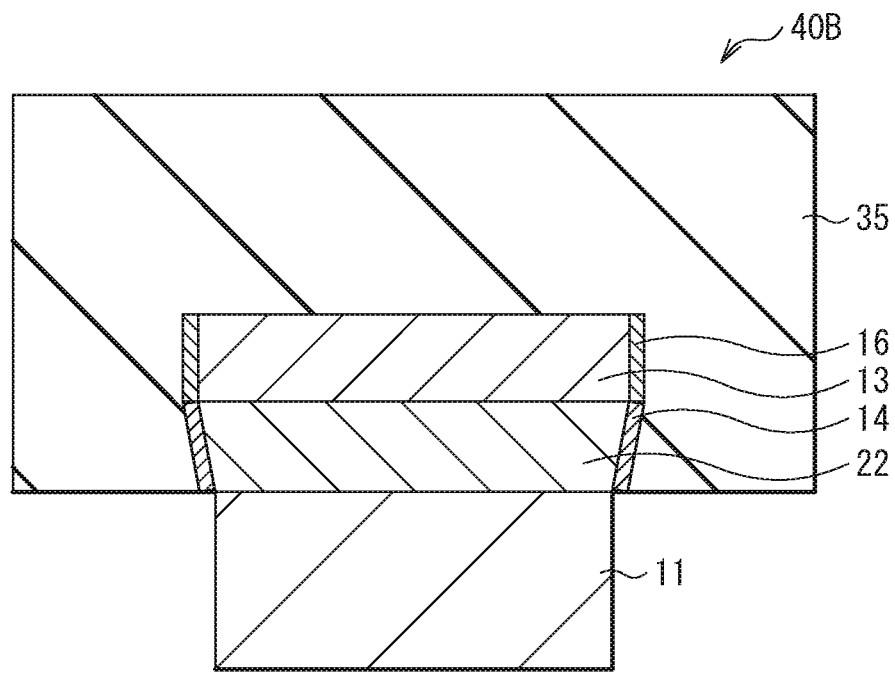
[FIG. 14]
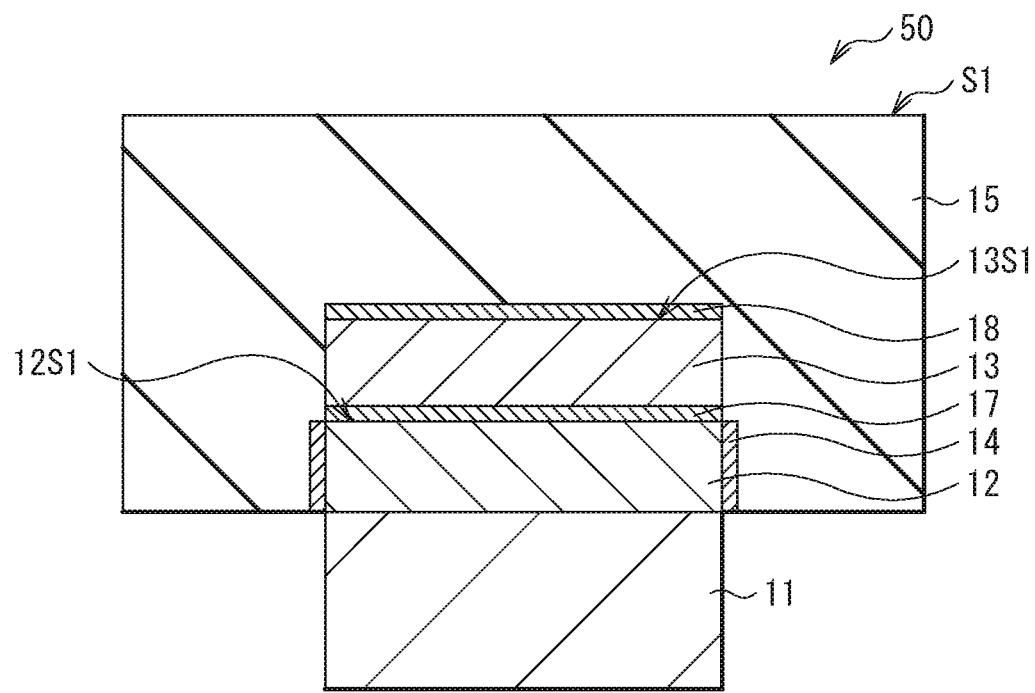

[FIG. 15]
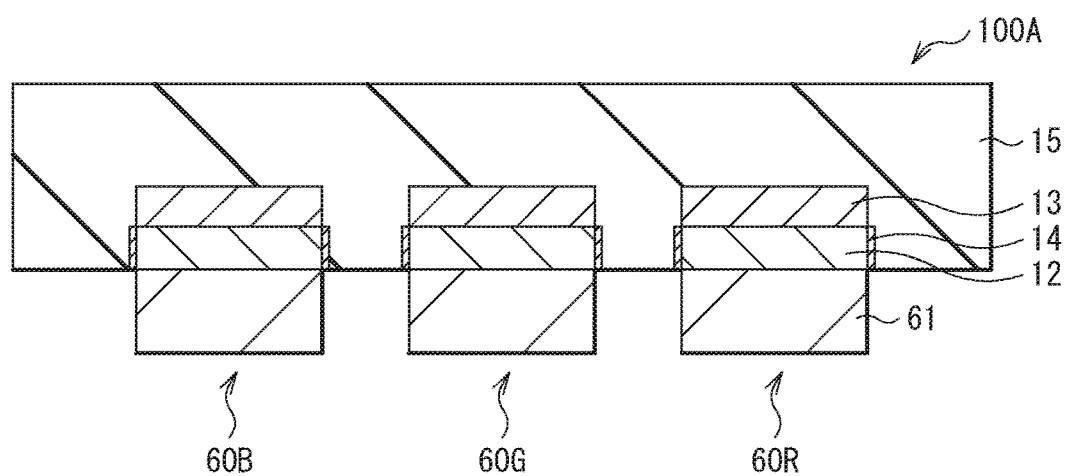
[FIG. 16]
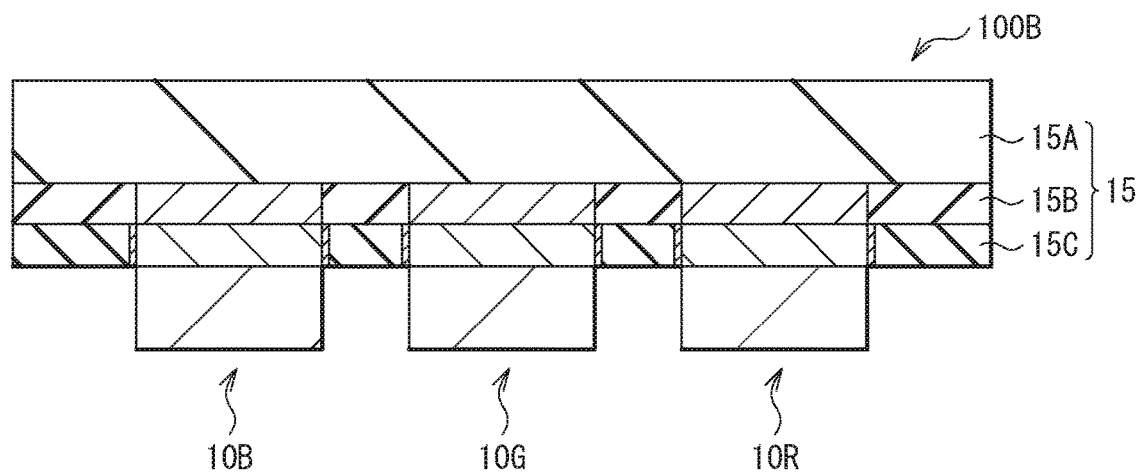

[FIG. 17]
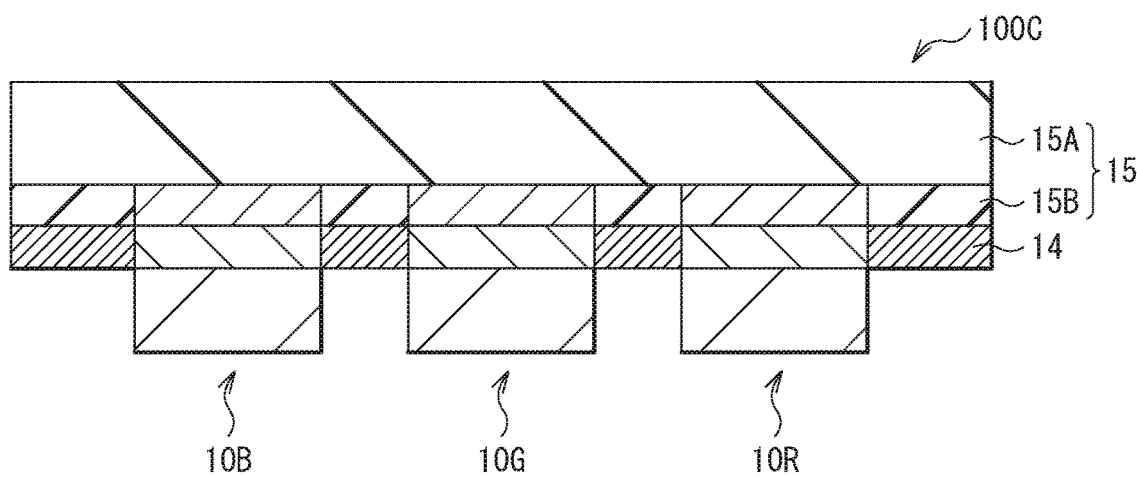
[FIG. 18]
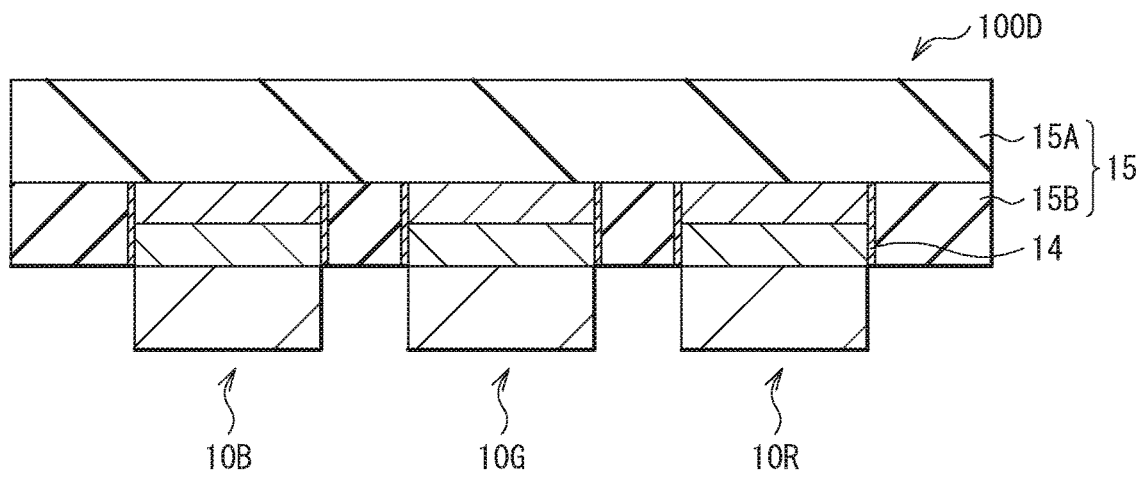

[FIG. 19]
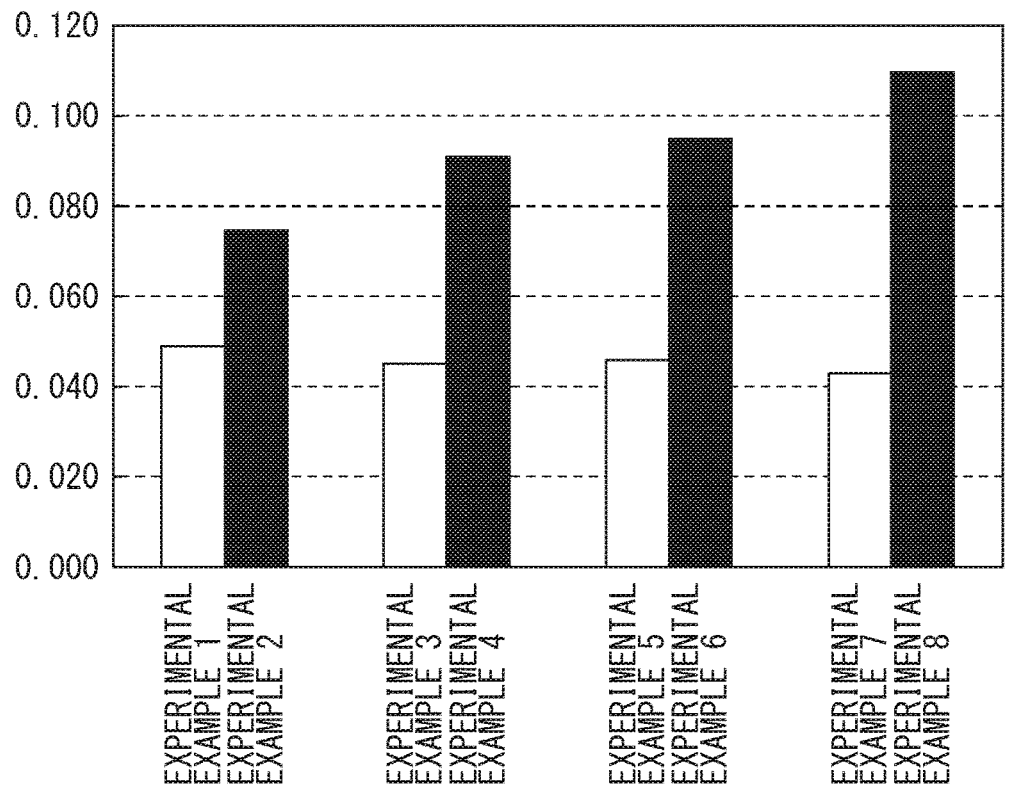
[FIG. 20]
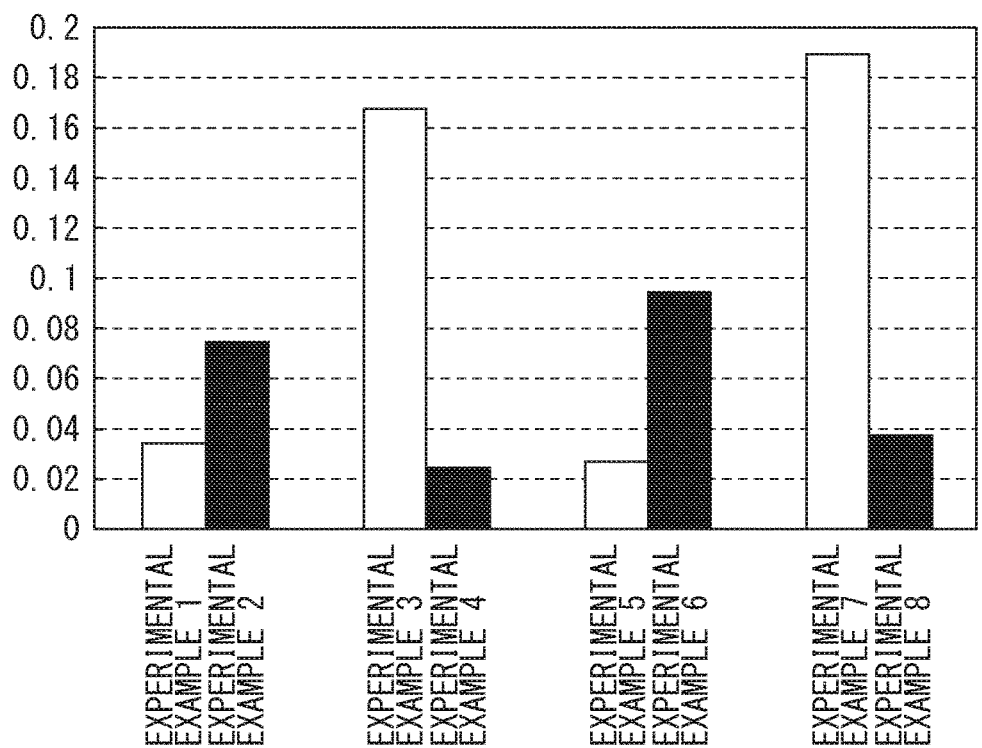

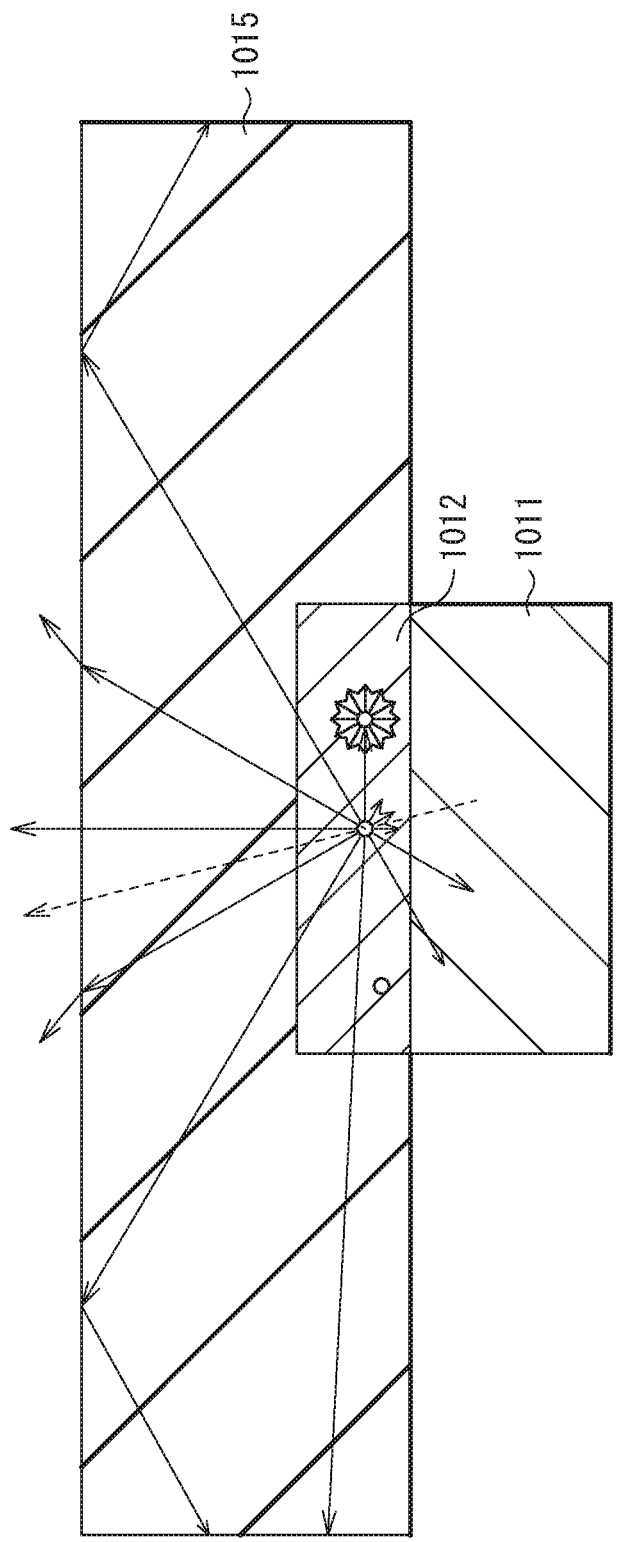
[FIG. 21]

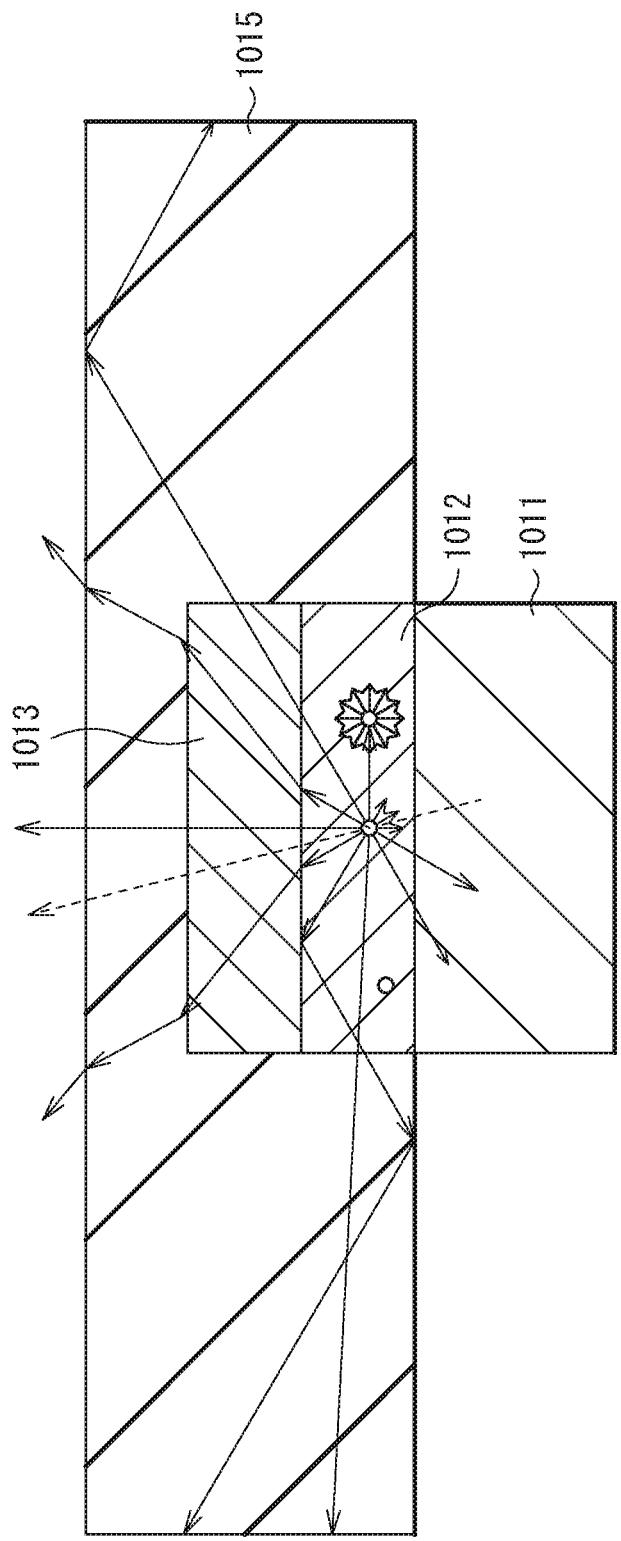
[FIG. 22]

[FIG. 23]
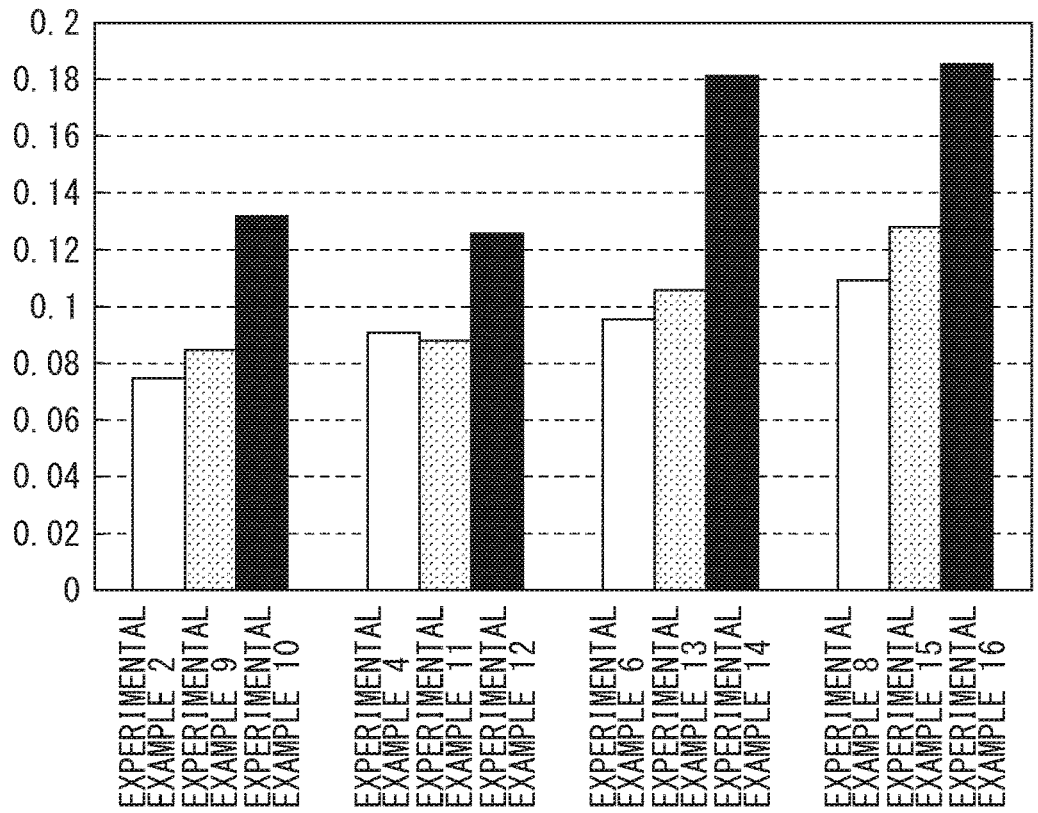
[FIG. 24]
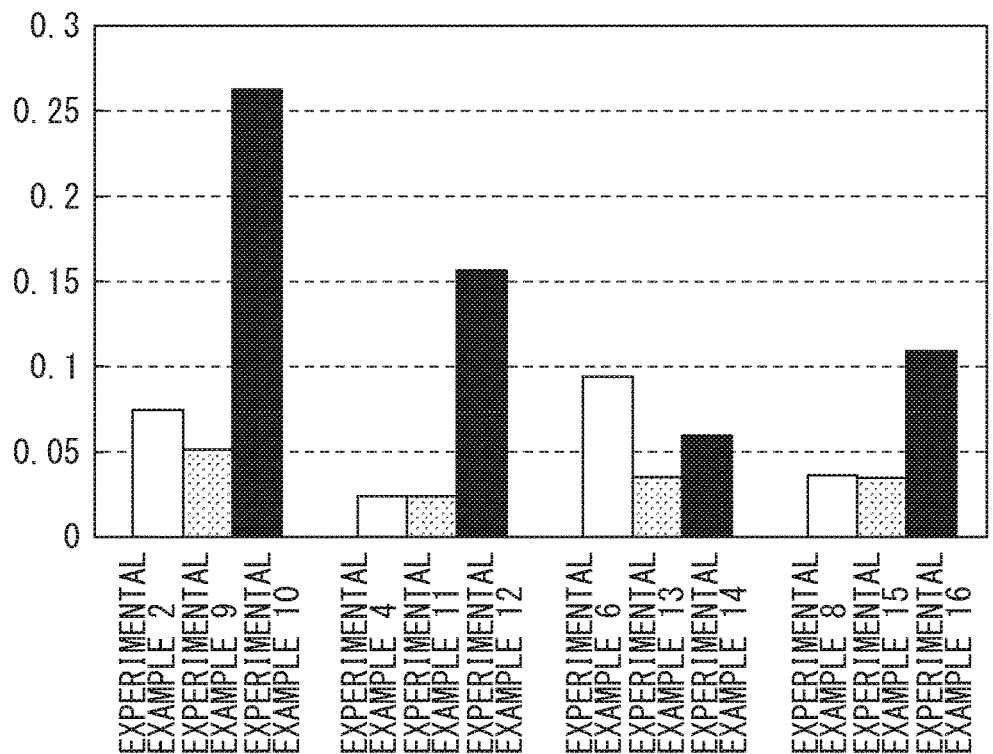

LIGHT-EMITTING DEVICE AND IMAGE DISPLAY APPARATUS WITH REFLECTION FILM ON SIDE SURFACE AND LAYERS HAVING DIFFERENT REFRACTIVE INDICES

CROSS REFERENCE TO RELATED APPLICATIONS

This application is a U.S. National Phase of International Patent Application No. PCT/JP2019/037804 filed on Sep. 26, 2019, which claims priority benefit of Japanese Patent Application No. JP 2018-194120 filed in the Japan Patent Office on Oct. 15, 2018. Each of the above-referenced applications is hereby incorporated herein by reference in its entirety.

TECHNICAL FIELD

The present disclosure relates, for example, to a light-emitting device having a phosphor layer on a light-emitting surface side of a solid-state light source and an image display apparatus including the light-emitting device.

BACKGROUND ART

Recently, an illumination apparatus or an image display apparatus has been widely used that includes a plurality of light emitting diodes (LEDs). For example, an LED display has been proposed that includes a plurality of pixels arranged in a two-dimensional matrix. Each of the pixels includes three LEDs: one emitting red (R) light, one emitting green (G) light, and one emitting blue (B) light.

Incidentally, the emission wavelength of an LED is determined by the band gap energy of a material used in the light-emitting layer. The emission wavelength becomes shorter as the band gap energy increases. The material generally used is a ternary mixed crystal semiconductor material, such as GaInP for red LEDs, and GaInN for green LEDs and blue LEDs, or a quaternary mixed crystal semiconductor material obtained by adding aluminum (Al) to the ternary mixed crystal semiconductor material. Differences in materials of the light-emitting layer affect not only emission wavelengths but also electrical characteristics, optical characteristics, and temperature characteristics. Therefore, for an LED display including a combination of red, green, and blue LEDs, each of the LEDs needs to be individually controlled.

On the other hand, Non-Patent Literature 1, for example, reports a light-emitting device of a color conversion type that includes a phosphor disposed on an LED. The phosphor serves as a light source of an LED display. The light-emitting device emits light of a desired color through color conversion using the phosphor.

CITATION LIST

Non-Patent Literature

Non-Patent Literature 1: H.-V. Han, et al., Opt. Express 23, 32504?32515 (2015)

SUMMARY OF THE INVENTION

Incidentally, an improvement in light extraction efficiency of the light-emitting device in an LED display has been needed to achieve high brightness and low power consumption.

It is desirable to provide a light-emitting device and an image display apparatus that make it possible to improve light extraction efficiency.

A light-emitting device of one embodiment of the present disclosure includes: a solid-state light source emitting excitation light; a phosphor layer having a first refractive index, provided on a light-emitting surface side of the solid-state light source, and having a first reflection film on a side surface; a low refractive layer provided on the phosphor layer and having a second refractive index less than the first refractive index; and a sealing member encapsulating the phosphor layer and the low refractive layer and having a third refractive index greater than or equal to the second refractive index.

An image display apparatus of one embodiment of the present disclosure includes a plurality of the light-emitting devices of the above embodiment.

In the light-emitting device of one embodiment of the present disclosure and the image display apparatus of one embodiment, the phosphor layer having the first reflection film on its side surface is provided on the light-emitting surface side of the solid-state light source that emits excitation light. Further, the low refractive layer is provided on the phosphor layer. The low refractive layer has the second refractive index less than the refractive index (first refractive index) of the phosphor layer. The sealing member having the third refractive index greater than or equal to the second refractive index covers upper surfaces and side surfaces of the phosphor layer and the low refractive layer. Accordingly, a total reflection interface is formed at an interface between the phosphor layer and the low refractive layer. Fluorescent light reflected at the interface is converted into fluorescent light having a total reflection angle or less in the phosphor layer again.

BRIEF DESCRIPTION OF DRAWINGS

FIG. 1 is a schematic cross-sectional view illustrating an exemplary configuration of a light-emitting device according to a first embodiment of the present disclosure.

FIG. 2 is a schematic diagram for explaining the configuration of a phosphor layer illustrated in FIG. 1.

FIG. 3 is a schematic cross-sectional view illustrating an exemplary configuration of a light-emitting unit including a plurality of the light-emitting devices illustrated in FIG. 1.

FIG. 4 is a perspective view illustrating an exemplary configuration of an image display apparatus including the light-emitting unit illustrated in FIG. 3.

FIG. 5 is a schematic diagram illustrating an exemplary layout of the image display apparatus illustrated in FIG. 4.

FIG. 6 is a pixel circuit diagram of an active-matrix driven type.

FIG. 7 is a diagram for explaining light refraction.

FIG. 8 is a diagram for explaining the refraction of fluorescent light in the light-emitting device illustrated in FIG. 1.

FIG. 9 is a schematic cross-sectional view illustrating an exemplary configuration of a light-emitting device according to a second embodiment of the present disclosure.

FIG. 10 is a diagram for explaining the inclination angle of a side surface of a phosphor layer illustrated in FIG. 9.

FIG. 11 is a schematic cross-sectional view illustrating an exemplary configuration of a light-emitting device according to a third embodiment of the present disclosure.

FIG. 12 is a schematic cross-sectional view illustrating an exemplary configuration of a light-emitting device according to a fourth embodiment of the present disclosure.

FIG. 13 is a schematic cross-sectional view illustrating another exemplary configuration of the light-emitting device according to the fourth embodiment of the present disclosure.

FIG. 14 is a schematic cross-sectional view illustrating an exemplary configuration of a light-emitting device according to a fifth embodiment of the present disclosure.

FIG. 15 is a schematic cross-sectional view illustrating another exemplary configuration of a light-emitting unit according to a modification example of the present disclosure.

FIG. 16 is a schematic cross-sectional view illustrating another exemplary configuration of the light-emitting unit according to the modification example of the present disclosure.

FIG. 17 is a schematic cross-sectional view illustrating another exemplary configuration of the light-emitting unit according to the modification example of the present disclosure.

FIG. 18 is a schematic cross-sectional view illustrating another exemplary configuration of the light-emitting unit according to the modification example of the present disclosure.

FIG. 19 is a characteristic diagram illustrating the light extraction efficiency in Experimental Examples 1 to 8.

FIG. 20 is a characteristic diagram illustrating non-Lambertian light distribution properties in Experimental Examples 1 to 8.

FIG. 21 is a diagram for explaining the refraction of fluorescent light in Experimental Example 1.

FIG. 22 is a diagram for explaining the refraction of fluorescent light in Experimental Example 5.

FIG. 23 is a characteristic diagram illustrating the light extraction efficiency in Experimental Examples 2, 4, 6, and 8 and Experimental Examples 9 to 16.

FIG. 24 is a characteristic diagram illustrating non-Lambertian light distribution properties in Experimental Examples 2, 4, 6, and 8 and Experimental Examples 9 to 16.

MODES FOR CARRYING OUT THE INVENTION

Hereinafter, some embodiments of the present disclosure are described in detail with reference to the drawings. It is to be noted that the following description is a mere example of the present disclosure, and the present disclosure should not be limited to the embodiments described below. The arrangement, size, proportion, or the like of each component should not be limited to those illustrated in the drawings of the present disclosure. Note that the description is given in the following order.
1. First Embodiment (Example in which a low refractive layer is provided immediately above a phosphor layer and sealed with a sealing member)
   1-1. Configuration of Light-Emitting Device
   1-2. Configuration of Light-Emitting Unit
   1-3. Configuration of Image Display Apparatus
   1-3. Workings and Effects
2. Second Embodiment (Example in which a side surface of the phosphor layer is an inclined surface)
3. Third Embodiment (Example in which scattering particles are provided above the low refractive layer that is sealed together with the phosphor layer with a sealing member)
4. Fourth Embodiment (Example in which a reflection film is further provided on a side surface of the low refractive layer)
5. Fifth Embodiment (Example in which an interface between the phosphor layer and the low refractive layer and an interface between the low refractive layer and the sealing member are each provided with an anti-reflection structure)
6. Modification Examples (Other exemplary configurations of the light-emitting unit)
7. Working Examples

1. FIRST EMBODIMENT

FIG. 1 schematically illustrates an exemplary cross-sectional configuration of a light-emitting device according to a first embodiment (light-emitting device 10) of the present disclosure. FIG. 2 schematically illustrates the materials of a phosphor layer 12 illustrated in FIG. 1. The light-emitting device 10 is preferably used as a display pixel of an image display apparatus (e.g., image display apparatus 1, see FIG. 4), which may be a so-called LED display, for example.

The light-emitting device 10 according to the present embodiment includes, in order, the phosphor layer 12 and a low refractive layer 13 provided on a light-emitting surface side of a solid-state light source 11. The phosphor layer 12 and the low refractive layer 13 are encapsulated in a sealing member 15. The phosphor layer 12 has a first refractive index (n1), and the low refractive layer 13 has a second refractive index (n2) less than the first refractive index. The sealing member 15 has a third refractive index (n3) greater than or equal to the second refractive index. Further, a reflection film 14 is provided on a side surface of the phosphor layer 12.

(1-1. Configuration of Light-Emitting Device)

The solid-state light source 11 emits excitation light to excite phosphor particles 121 (to be described later) included in the phosphor layer 12. For example, the solid-state light source 11 is an LED including a Group III-V compound semiconducting material. LEDs have advantages over other solid-state light sources in that having higher efficiency, less power consumption, higher responsiveness, and longer service life. In addition, LEDs, which are fabricated through semiconductor processes, are able to be subjected to high-precision microfabrication and has the advantage of low manufacturing costs. The solid-state light source 11 according to the present embodiment preferably emits ultraviolet light having an emission wavelength of 360 nm or greater and 430 nm or less, for example, or light in a blue band having an emission wavelength of 430 nm or greater and 500 nm or less, for example. The solid-state light source 11 desirably includes a light-emitting layer including a GaInN material.

It is to be noted that the solid-state light source 11 may be any device that excites the phosphor particles 121 included in the phosphor layer 12 and should not be limited to the LED. For example, the solid-state light source 11 may be a laser diode (LD) including a compound semiconductor, an organic light-emitting diode (OLED) including an organic material, or a quantum-dot LED (QDLED) including a light-emitting layer that includes quantum dots.

The phosphor layer 12 absorbs excitation light emitted from the solid-state light source 11 to emit fluorescent light. The phosphor layer 12 has a first refractive index (n1). As illustrated in FIG. 2, for example, the phosphor layer 12 includes the plurality of phosphor particles 121 and a plurality of scattering particles 122 dispersed in a filler 123, for example.

The phosphor particle 121 is a particulate phosphor that absorbs excitation light emitted from the solid-state light source 11 and emits fluorescent light having a blue wavelength of 430 nm or greater and 500 nm or less, a green wavelength of 500 nm or greater and 550 nm or less, or a red wavelength of 610 nm or greater and 780 nm or less, for example. The phosphor particle 121 may be, for example, an inorganic phosphor, an organic phosphor, or a quantum-dot phosphor. The phosphor particle 121 desirably has a mean particle diameter of 100 nm or less. In such a case, it is desirable to use a quantum-dot phosphor, for example. Alternatively, it is desirable to use a fine particle phosphor of 3 µm or less, for example.

The fluorescent light wavelength (fluorescent light color) of the quantum-dot phosphor is determined by the band gap energy of the material of the quantum dot. Therefore, it is desirable to select a material in accordance with a desired fluorescent color. For example, to obtain red fluorescent light, the quantum-dot phosphor material is preferably selected from InP, GaInP, InAsP, CdSe, CdZnSe, CdTeSe, and CdTe, for example. To obtain green fluorescent light, the quantum-dot phosphor material is preferably selected from InP, GaInP, ZnSeTe, ZnTe, CdSe, CdZnSe, CdS, and CdSeS, for example. To obtain blue fluorescent light, the quantum-dot phosphor material is preferably selected from ZnSe, ZnTe, ZnSeTe, CdSe, CdZnSe, CdS, CdZnS and CdSeS, for example. Note that the quantum-dot phosphor material is not limited to the examples described above. For example, $CuInSe_2$, $CuInS_2$, CuInGaS, and $AgInS_2$ may be used. Alternatively, perovskite nanophosphors, such as $CsPb(Cl/Br)_3$, $CsPbBr_3$, $CsPb(I/Br)_3$, and $CsPbI_3$, may be used, for example.

The fluorescent color of the quantum-dot phosphor may be controlled by its particle diameter. For example, the fluorescent light wavelength becomes shorter as the particle diameter becomes smaller. To obtain fluorescent light of high color purity, it is desirable to select a phosphor particle having a controlled particle diameter.

The quantum-dot phosphor has a mean particle diameter of, for example, 5 nm or greater and 100 nm or less. The quantum-dot phosphor preferably has a core/shell structure including a core portion having a mean particle diameter of, for example, about 2 nm to 10 nm and emitting light, and a shell layer covering and protecting the core portion. The shell layer includes one or more layers. The shell layer may also be covered with an inorganic film, such as silicon oxide ($SiO_2$) or aluminum oxide ($Al_2O_3$). A large number of organic ligands are coordinated on the surface of the quantum-dot phosphor. When the quantum-dot phosphors are mixed in a solvent, the organic ligands suppress aggregation of the quantum-dot phosphors and improve the dispersibility of the quantum-dot phosphors.

The scattering particle 122 scatters excited light emitted from the solid-state light source 11 and fluorescent light emitted from the phosphor particle 121, and reduces the polarization of the light distribution. The scattering particle 122 preferably has a mean particle diameter greater than that of the phosphor particle 121, and a refractive index greater than that of the filler 123. It is preferable that the scattering particle 122 be a dielectric substance having a particle diameter of 100 nm or greater and 1000 nm or less, for example. Specific examples of the material of the scattering particle 122 include, for example, silicon oxide ($SiO_2$), titanium oxide ($TiO_2$), aluminum oxide ($Al_2O_3$), zirconium oxide ($ZrO_2$), aluminum nitride (AlN), boron nitride (BN), and zinc oxide (ZnO), for example.

Note that scattering particles 122 may be, for example, bubbles mixed in the filler 123 or aggregations of the phosphor particles 121.

The filler 123 is for uniformly dispersing the phosphor particles 121 and the scattering particles 122. For example, the filler 123 is preferably formed using a material having light transmittance to excitation light. Specific examples of the material of the filler 123 include an ultraviolet curable resin and a thermosetting resin. In addition, sol-gel glass or the like may be used.

Note that the filler 123 is not necessarily required, and the phosphor particles 121 and the scattering particles 122 may be encapsulated in a hollow structure.

It is preferable that phosphor layer 12 have substantially the same area as the light-emitting surface of the solid-state light source 11. The phosphor layer 12 preferably absorbs 80% or greater of excitation light, for example, and preferably has a film thickness (hereinafter, simply referred to as thickness) is 5 µm or greater and 100 µm or less, for example. It is desirable that the density of the quantum-dot phosphors contained in the phosphor layer 12 be 0.5% by volume or greater and 50% by volume or less, for example.

The phosphor layer 12 may be formed by, for example, photolithography or micromolding depending on its thickness or size. For example, a resin barrier may be formed by photolithography or micromolding, and the reflection film 14 may be formed on a surface of the resin barrier by deposition or plating. Thereafter, the resin barrier may be filled with quantum-dot phosphors or a mixture of the quantum-dot phosphors and a resin to form the phosphor layer 12.

Photolithography is a technique for pattern exposing a base surface coated with a photosensitive resist to generate a pattern including exposed portions and unexposed portions. Photolithography is mainly used to manufacture semiconductor devices, printed boards, printing plates, and the like. Photolithography enables very precise patterning. Photolithography with a resist used in a micro-electromechanical system (MEMS) for three-dimensional processing of materials such as Si also enables fabrication of a structure having an aspect ratio greater than 10.

Micromolding is a microfabrication technique for transferring a pattern on the order of micrometers on a resin held between a mold and a base. Micromolding is a microfabrication technique that includes four steps: (1) coating, (2) pressing, (3) curing (with UV light or heat) and (4) releasing, and is expected to achieve high throughput with relatively simple equipment and mass production at low costs.

To fill the quantum-dot phosphors, for example, an ink-jet type dispenser or a needle-type dispenser that discharges or applies a mixture of the quantum-dot phosphors and a resin is used depending on the viscosity of the mixture. This method is classified as a non-plate printing method. This method allows the barrier to be selectively filled with the quantum-dot phosphors, leading to an increase in the utilization efficiency of the quantum-dot phosphor material. Alternatively, the quantum-dot phosphors may be applied to a predetermined place by a plate printing method, such as screen printing or gravure printing. Still alternatively, the quantum-dot phosphor material may be applied to the entirety of the base by a spin coater, for example.

The low refractive layer 13 is for forming a total-reflection interface immediately above the phosphor layer 12. The low refractive layer 13 has a refractive index (second refractive index, n2) less than the refractive index (first refractive index, n1) of the phosphor layer 12. The low refractive layer 13 may be formed using, for example, a silicon oxide ($SiO_2$), an aerogel, or the like. Alternatively, the low refractive layer 13 may be an air layer (air gap). The refractive index of the low refractive layer 13 formed of silicon oxide ($SiO_2$) may be controlled by the density of silicon oxide ($SiO_2$). For example, the low refractive layer 13 having a refractive index of about 1.1 may be formed. For the low refractive layer 13 formed of an aerogel, the low refractive layer 13 having a refractive index of about 1.01 may be formed, for example. For the low refractive layer formed of an air gap, the refractive index of the low refractive layer 13 is approximately 1.0.

The low refractive layer 13 is desirably formed so as to entirely cover an upper surface (surface 12S1) of the phosphor layer 12, and preferably has a size appropriately determined in accordance with the size of a light extraction port of the image display apparatus 1 or any other conditions, for example. The low refractive layer 13 only have to have a thickness greater than or equal to the wavelengths of the excitation light and the fluorescent light, and more preferably, a thickness less than or equal to ⅕ of the device size. In a case where the light-emitting device of the present embodiment is a so-called micro-LED, the low refractive layer 13 has a thickness of 0.5 µm or greater and 30 µm or less, for example.

The reflection film 14 is provided on a side surface of the phosphor layer 12. The reflection film 14 is for reflecting excited light emitted from the solid-state light source 11 and scattered by the scattering particles 122, for example, and fluorescent light emitted from the phosphor particle 121, into the phosphor layer 12. It is preferable that reflection film 14 be formed using a material having a high reflectance for excited light and fluorescent light at any light incidence angle. Specific examples of the material of the reflection film 14 include gold (Au), silver (Ag), aluminum (Al), and platinum (Pt), for example.

The sealing member 15 seals the phosphor layer 12 and the low refractive layer 13 and transmits fluorescent light. Further, for the low refractive layer 13 formed of air, the sealing member 15 covers the outer periphery of the low refractive layer 13 and is provided so as to encapsulate the phosphor layer 12 and the low refractive layer 13. Further, the sealing member 15 serves to protect the phosphor layer 12 and the low refractive layer 13 from external shocks, and serves also as a transparent substrate 130 in the image display apparatus 1 described later, for example. The sealing member 15 has a refractive index (third refractive index, n3) greater than or equal to the refractive index (n2) of the low refractive layer 13. The sealing member 15 is preferably formed using a material having a low absorptivity for fluorescent light. Specific examples of the material of the sealing member 15 include, for example, polypropylene, polyethylene, polystyrene, AS resin, ABS resin, methacrylic resin, polyvinyl chloride, polyacetal, polyamide, polycarbonate, modified polyphenylene ether, polybutylene terephthalate, polyethylene terephthalate, polysulfone, polyether sulfone, polyphenylene sulfide, polyamideimide, polymethylpentene, liquid crystal polymer, epoxy resin, phenorl resin, urea resin, melanin resin, diallyl phthalate resin, unsaturated polyester resin, polyimide, polyurethane, and silicone resin, or a mixture thereof.

Note that, in a case where the image display apparatus 1 is provided with a black resin layer or a screen, the sealing member 15 preferably includes a resin material having a refractive index matching the refractive index of the constituent material of the black resin layer or the screen. The sealing member 15 has a thickness of, for example, 10 µm or greater and 1000 µm or less. The sealing member 15 preferably has a thickness of, for example, 5 µm or greater and 1000 µm or less on an upper surface (surface 13S1) of the low refractive layer 13. The sealing member 15 has a flat upper surface (surface 51). Fluorescent light outputted from the phosphor layer 12 is emitted through the upper surface (surface 51) of the sealing member 15.

(1-2. Configuration of Light-Emitting Unit)

FIG. 3 schematically illustrates a cross-sectional configuration of a light-emitting unit 100 used as an display pixel of the image display apparatus 1, for example.

In the light-emitting unit 100, a plurality of light-emitting devices 10 (e.g., three light-emitting devices 10B, 10G, and 10R in FIG. 3) are arranged in a line with a predetermined gap therebetween. The light-emitting unit 100 has, for example, an elongated shape extending in the arrangement direction of the light-emitting devices 10. The gap between two adjacent light-emitting devices 10 is, for example, greater than or equal to the size of each light-emitting device 10. Note that each gap may be less than the size of each light-emitting device 10 in some cases.

The light-emitting devices 10 emit light of different wavelengths from each other. For example, as illustrated in FIG. 3, the three light-emitting devices 10 are a light-emitting device 10B emitting fluorescent light in a blue band (Lb), and light-emitting device 10G emitting fluorescent light in a green band (Lg), and light-emitting device 10R emitting fluorescent light in a red band (Lr). For example, in a case where the light-emitting unit 100 has an elongated shape extending in the arrangement direction of the light-emitting devices 10, the light-emitting device 10B is disposed, for example, in the vicinity of one short side of the light-emitting unit 100, and the light-emitting device 10R is disposed, for example, in the vicinity of the other short side of the light-emitting unit 100 different from the short side adjacent to the light-emitting device 10B. The light-emitting device 10G is disposed, for example, between the light-emitting device 10R and the light-emitting device 10B. Note that the arrangement of each of the light-emitting devices 10B, 10G, and 10R described above is a mere example, and is not limited to the one described above.

Each of the light-emitting devices 10B, 10G, and 10R is provided, for example, with the phosphor layer 12 and the low refractive layer 13 on the solid-state light source 11 that emits ultraviolet light as excitation light. The phosphor layer 12 and the low refractive layer 13 are covered by the sealing member 15 shared between the light-emitting devices 10B, 10G, and 10R. The phosphor layer 12 provided in the light-emitting device 10B includes the phosphor particles 121 emitting blue fluorescent light. The phosphor layer 12 in the light-emitting device 10G includes the phosphor particles 121 emitting green fluorescent light. The phosphor layer 12 in the light-emitting device 10R includes the phosphor particles 121 emitting red fluorescent light.

The sealing member 15 is provided so as to cover the side surfaces and the upper surfaces of the phosphor layer 12 and the low refractive layer 13 in each of the light-emitting devices 10B, 10G, and 10R, and is provided as a member shared between the light-emitting devices 10B, 10G, and 10R, as described above. In the light-emitting unit 100, the sealing member 15 has, for example, an elongated shape (e.g., a rectangular parallelepiped shape) extending in the arrangement direction of the light-emitting devices 10B, 10G, and 10R. The sealing member 15 has a short-side width larger than the width of each of the light-emitting devices 10B, 10G, and 10R. Additionally, as described above, the sealing member 15 may be used as the transparent substrate 130 in the image display apparatus 1 described below. In such a case, the sealing member 15 is formed as a member shared between the plurality of light-emitting units 100 arranged in a two-dimensional matrix.

(1-3. Configuration of Image Display Apparatus)

FIG. 4 is a perspective view schematically illustrating an exemplary configuration of the image display apparatus (image display apparatus 1). The image display apparatus 1 is a so-called LED display including an LED used as a display pixel. As illustrated in FIG. 4, for example, the image display apparatus 1 includes a display panel 110 and a non-illustrated drive circuit that drives the display panel 110.

The display panel 110 is a laminate of a mount board 120 and the transparent substrate 130. A surface of the transparent substrate 130 of the display panel 110 serves as an image display surface. The image display surface has a display region 1A at its central portion, and a frame region 1B surrounding the display region 1A. The frame region 1B is a non-display region.

FIG. 5 illustrates an exemplary layout in a region of the surface of the mount board 120 adjacent to the transparent substrate 130. The region corresponds to the display region 1A. In the region of the surface of the mount board 120 corresponding to the display region 1A, multiple data lines 221 are formed so as to extend in a predetermined direction, and arranged in parallel to each other at a predetermined pitch, as illustrated in FIG. 5, for example. Further, in the region of the surface of the mount board 120 corresponding to the display region 1A, multiple scanning lines 222 are formed so as to extend in a direction intersecting (e.g., orthogonal to) the extending direction of the data lines 221, and arranged in parallel to each other at a predetermined pitch, for example. The data lines 221 and the scanning lines 222 include an electrically conductive material, such as Cu (copper), for example.

The scanning lines 222 are formed on, for example, the outermost layer. For example, the scanning lines 222 are formed on, for example, an insulating layer (not illustrated) formed on a surface of the base. Note that the base of the mount board 120 is, for example, a glass base, a resin base, or the like. The insulating layer on the base includes, for example, silicon nitride ($SiN_x$), silicon oxide ($SiO_x$), aluminum oxide ($Al_xO_y$), or the like. In contrast, the data lines 221 are formed on a layer (e.g., a layer below the outermost layer) different from the outermost layer including the scanning lines 222. For example, the data lines 221 are formed in the insulating layer provided on the base. In addition to the scanning lines 222, a black is provided as needed on a surface of the insulating layer, for example. The black is for enhancing the contrast, and includes a light absorbing material. The black is formed at least in a region of the surface of the insulating layer in which pad electrodes 221B and 122B described below are not formed, for example. Note that the black may be omitted, as necessary.

Display pixels 223 are provided in the vicinity of intersections between the data lines 221 and the scanning lines 222 on the mount board 120. The plurality of display pixels 223 are arranged in a matrix in the display region 1A. The light-emitting unit 100 including the plurality of light-emitting devices 10 is mounted on each of the display pixels 223.

Note that FIG. 5 illustrates an example in which one display pixel 223 is configured by the three light-emitting devices 10R, 10G, and 10B that output red light, green light, and blue light, respectively.

Further, although the image display apparatus 1 illustrated in FIG. 4 is an exemplary image display apparatus of a passive matrix type, the light-emitting device 10 of the present embodiment may also be applied to an image display apparatus of an active-matrix type. Note that, for the image display apparatus of the active-matrix type, for example, the frame region 1B illustrated in FIG. 4 is not necessary.

In the passive matrix driving method, a time allocated to each light-emitting device is reduced with an increase in the number of the scanning lines. This generates the need for an increase in injected current with a decrease in the duty ratio, possibly reducing the light emission efficiency and the service life of the device. To avoid this, it is preferable to lower a maximum luminance set value. In addition, considering voltage drop and signal delay caused by wiring resistance and parasitic capacitance, a high-resolution image display apparatus with a large screen including a large number of scanning lines may be driven by a passive matrix driving method that drives a plurality of divided sections of the screen in parallel, or an active driving method that drives the light-emitting devices in an active manner. Note that, the parallel passive matrix driving may result in the complexity of the entire structure and an increase in the scale of the circuit of the display apparatus. For example, it is necessary to draw the line from each screen portion to the rear surface to couple the line to a drive circuit and divide and parallelize image signals in accordance with the respective screen portions. In contrast, in the active driving method, a signal voltage holding circuit and a voltage-current conversion circuit are provided in each pixel. Accordingly, the active driving method achieves higher luminance than the passive matrix driving without dividing the screen as described above or at least in a condition where the number of divided screen portions is small.

FIG. 6 illustrates an exemplary pixel circuit driven by a typical active-matrix driving method. In the active-matrix driving method, a switching transistor (Tr1), a driving transistor (Tr2) and a capacitor (Cs) are provided in each of the pixels (the light-emitting devices 10R, 10G, and 10B, the portions in the vicinity of the intersections between the data lines 311 and the scanning line 322). In the active-matrix driving method, Vsig is written in the capacitor using the switching transistor as a switch. In addition, the light-emitting devices are modulated using the driving transistor as a current source that controls current at a potential difference of the power supply (Vcc)–Vsig. Actually, there is a characteristic variation between the transistors. Thus, even if the same Vsig is written, the current applied to the light-emitting device varies between the pixels, resulting in a decrease in the display uniformity of the image display apparatus. Therefore, generally, a circuit for correcting variations in the transistor characteristics is added. However, in a case where the light-emitting device that changes in emission wavelength with a change in current is used, it is desirable to perform gray-scale control involving pulse-width modulation, as described later. This further complicates the circuit. In the light-emitting device of the present embodiment, the change in the emission wavelength in association with the change in current is reduced. Therefore, it is possible to provide the image display apparatus with a relatively simple current modulation driving circuit.

The light-emitting unit 100 is provided with a pair of terminal electrodes for each of the light-emitting devices 10R, 10G, and 10B, for example: one of the terminal electrodes is electrically coupled to the data line 221, for example, and the other terminal electrode is electrically coupled to the scanning line 222, for example. In specific, one of the terminal electrodes is electrically coupled to a pad electrode 221B at the end of a branch 221A of the data line 221, for example. The other terminal electrode is electrically coupled to a pad electrode 222B at the end of a branch 222A of the scanning line 222, for example.

Each of the pad electrodes 221B and 222B is formed, for example, on the outermost layer. For example, as illustrated in FIG. 4, each of the pad electrodes 221B and 222B is provided in a portion where each light-emitting unit 100 is mounted. The pad electrodes 221B and 222B include an electrically conductive material such as Au (gold), for example.

The drive circuit drives each of the display pixels 223 (each of the light-emitting units 100) on the basis of a video signal. The drive circuit includes, for example, a data driver that drives the data line 221 coupled to the display pixel 223, and a scan driver that drives the scanning line 222 coupled to the display pixel 223. The drive circuit may be mounted on the mount board 120, for example, or may be provided separately from the display panel 110 and coupled to the mount board 120 via a wiring line (not illustrated).

(1-4. Workings and Effects)

As described above, recently, an illumination apparatus or an image display apparatus has been widely used that includes a plurality of LEDs. For example, an LED display has been proposed that includes a plurality of pixels arranged in a two-dimensional matrix. Each of the pixels includes three LEDs: one emitting red (R) light, one emitting green (G) light, one emitting blue (B) light.

The basic structure of an LED is a pn junction in which a p-type semiconductor having a positive charge (hole) is physically joined to an n-type semiconductor having a negative charge (electron). The LED is provided with a light-emitting layer at the pn junction portion to obtain efficient light emission. Holes and electrons are injected into the light-emitting layer by applying a bias across the pn junction, which causes LED emission. As described above, the emission wavelength of an LED is determined by the band gap energy of a material used in the light-emitting layer. For example, the material generally used is a a ternary mixed crystal semiconductor material, such as GaInP for red LEDs, and GaInN for green LEDs and blue LEDs, or a quaternary mixed crystal semiconductor material obtained by adding aluminum (Al) to the ternary mixed crystal semiconductor material.

Differences in LED materials affect not only emission wavelengths but also electrical properties and optical properties. Thus, to represent gray scale and color tone in LED displays, for example, the emission intensities of the respective LEDs of R/G/B colors need to be individually adjusted. One example of the adjustment methods is a method based on a current value. This enables to increase the light emission intensity of the LED by increasing the current flowing therethrough. However, the dependency of the emission intensity and the emission efficiency on the current values is different between the respective LEDs of R/G/B colors. In particular, the tendency of change in the emission intensity is different among the red LED, the green LED, and the blue LED having different materials. In addition, the driving voltage of the red LED is in the 2V range, while that of the green LED and the blue LED is in the 3V range. Therefore, these LEDs need to be individually controlled independent from each other to control the gray-scale and color tone. Furthermore, for the green LED and the blue LED including GaInN materials, blue shifts in emission wavelengths are observed with an increase in current, and the amount of change is more prominent in the green LED than in the blue LED. This induces an unintentional tone change.

For these reasons, it is difficult to control LEDs with a current value. To solve such an issue, a control method involving pulse width modulation has been proposed. Through this method, a predetermined pulse voltage is applied to LEDs to represent the gray-scale by the pulse width (duty ratio). Such pulse width modulation, not causing a change in the value of current flowing through the LED, does not cause the wavelength shift, but raises an issue of an increase in costs due to a complicated drive circuit.

Furthermore, the difference in LED materials also affects the temperature characteristics. When the ambient temperature is increased, an LED has following features: (1) the effective band gap energy is reduced, which causes the red shift of the emission wavelength; (2) the rate of holes and electrons that do not contribute to light emission is increased, which lowers the light output; and (3) the driving voltage is reduced due to a change in temperature depending on the electrical conductivity. The degree of these changes greatly differs depending on the material or emission wavelength of the LEDs. In addition, the degree of the luminance deterioration after long-term use of LEDs also varies depending on the material or emission wavelength. Thus, correction for each LED is necessary.

As described above, for the LED display including a combination of red, green, and blue LEDs, the LEDs arranged in each pixel need to be individually and accurately controlled in accordance with their characteristics. Moreover, considering the application of the LED display, issues of the LEDs go beyond the individual control for each LED.

Metal organic chemical vapor deposition (MOCVD) is widely used to fabricate LEDs. MOCVD is a method that involves supplying the source gas of a LED material in a gas phase and growing a semiconductor thin film on a base surface heated by decomposition and chemical reactions. For example, a group-III organometallic material may be used, such as an indium (In) material including tri-methyl-indium (TMIn), a gallium (Ga) material including tri-methyl-gallium (TMGa), or an aluminum (Al) material including tri-methyl-aluminum (TMAl). For the group-V source gas, $AsH_3$, which is a hydride of arsenic (As), $PH_3$, which is a hydride of phosphorus (P), $NH_3$, which is a hydride of nitrogen (N), or the like is used, for example. For the base, GaAs, $Al_2O_3$, Si, GaN, or the like is used, for example. In such a case, unevenness occurs in the film thickness and composition due to temperature unevenness of the base or turbulence of the supplied gas flow. The unevenness is observed as unevenness of the base or unevenness of the emission wavelength for each base. In particular, a GaInN-based LED tends to have a larger wavelength unevenness as the wavelength increases. LEDs are fabricated by dividing a LED film grown on the base into multiple pieces and providing a metal electrode on each piece. Thus, the wavelength unevenness of the LED film is taken over as the wavelength unevenness of the LEDs. To obtain uniform color emission of an LED display, careful attention should be paid when sorting LEDs to be arranged, randomly arranging LEDs, and arranging pixels.

A typical image display apparatus also requires high resolution and a wide viewing angle. To achieve high resolution, it is necessary to reduce the pixel pitch, which inevitably resulting in a reduction in the pixel area, that is, the LED size. The reduction in the LED size contributes to an improvement in the contrast, and in turn, a reduction in the unit cost of the LED. However, a remarkable reduction in efficiency has been confirmed, in particular, LEDs including GaInP materials due to the reduction in the sizes of the LEDs. Further, to achieve a wide viewing angle, it is desirable that the light distribution characteristic of the pixel be the Lambertian light distribution.

As described above, the LED display that includes a combination of red, green, and blue LEDs including different materials needs control or configuration to cancel the different characteristics of the LEDs. This results in very high cost. Therefore, equalizing LED characteristics has been a major challenge. Further, development of a high-efficiency micro light-emitting device with the Lambertian light distribution has been desired to achieve an improvement in performance and a reduction in cost of the image display apparatus.

As a means for addressing the issue of the LEDs used as light sources (pixels) of the LED display, a light-emitting device of a color conversion type has been proposed that excites a phosphor using a micro LED and obtain a desired color by color conversion. However, just applying the phosphor on the LED leads to a low efficiency and finds it difficult to obtain sufficient luminance, which will be described in detail later.

For example, as a means for improving the efficiency of an LED, a method has been reported that improves the light extraction efficiency by covering the LED with a sealing layer having a flat light-emitting surface and providing a low refractive layer on the light-emitting surface of the LED. However, it has been confirmed that a sufficient effect is not obtained when this method is applied to the light-emitting device of the color conversion type described above.

In addition, as an example combination of a phosphor and an LED, for example, a light-emitting device including a concave case accommodating an LED and filled with phosphor particles or a light-emitting device including a light-emitting element covered with a dome-shaped resin layer has been proposed. However, these light-emitting devices described above have a larger size, and thus find it difficult to apply to an LED display. Further, when a micro LED is used as a light-emitting element, it is very difficult to place the LED in the concave case and couple the LED to a wiring line with high accuracy. Furthermore, the light-emitting device described above is not suitable for an image display apparatus with high anisotropy of light distribution and a wide viewing angle.

In contrast, the light-emitting device 10 of the present embodiment includes: the phosphor layer 12 provided on the light-emitting surface side of the solid-state light source 11 that emits excitation light and having the reflection film 14 on its side surface; and the low refractive layer 13 provided on the phosphor layer 12 and having the refractive index n2 less than the refractive index n1 of the phosphor layer 12. The upper surfaces and the side surfaces of the phosphor layer 12 and the low refractive layer 13 are covered with the sealing member 15 having the refractive index n3 greater than or equal to the refractive index n2 of the low refractive layer 13.

FIG. 7 illustrates light refractions in a medium A and a medium B having different refractive indices from each other. When light travels from the medium A having a high refractive index na to the medium B having a low refractive index nb, the light is refracted in accordance with the ratio between the refractive indices of the respective media. The relationship is expressed by Snell's law: na·sin θa=nb·sin gθb. Here, when θb=π/2 and θa=θar are satisfied, that is, when the relationship, sin θar=nb/na is satisfied, the light from the medium A is no longer incident on the medium B, and the light having an angle component of θar or greater is totally reflected into the medium A without traveling to the medium B. This θar is referred to as a total reflection angle.

FIG. 8 illustrates fluorescent light refractions in the light-emitting device 10 of the present embodiment. In the light-emitting device 10, part of excitation light emitted from the solid-state light source 11 is absorbed by the phosphor particles 121, and the phosphor particles 121 having absorbed the excitation light isotropically emit fluorescent light in accordance with their conversion efficiency. Out of the fluorescent light emitted toward an interface between the phosphor layer 12 and the low refractive layer 13, the fluorescent light having an angle component less than or equal to the total reflection angle at the interface between the phosphor layer 12 and the low refractive layer 13 is refracted at the interface and travels to the low refractive layer 13. The fluorescent light satisfying the total reflection at the interface between the phosphor layer 12 and the low refractive layer 13 is reflected at the interface and returns to the phosphor layer 12. Part of the fluorescent light (reflected light) reflected at the interface between the phosphor layer 12 and the low refractive layer 13 reaches the side surface of the phosphor layer 12, but is reflected by the reflection film 14 to the phosphor layer 12 without leaking to the outside. The fluorescent light emitted toward the side of the phosphor layer 12 is reflected by the reflection film 14 to the phosphor layer 12 without leaking to the outside in the same manner as the fluorescent light reflected at the interface between the phosphor layer 12 and the low refractive layer 13 and reaching the side surface of the phosphor layer 12. In the process of repeating this reflection, the angle component is enlarged to have the total reflection angle or less by self-absorption or self-light emission of the phosphor particles 121 or scattering by the scattering particles, and is extracted to the outside.

It is to be noted that the fluorescent light emitted toward the solid-state light source 11 is refracted or totally reflected in accordance with the refractive index of the solid-state light source 11. However, in almost all cases, the total reflection does not occur because of the refractive index of the solid-state light source greater than that of the filler in the phosphor layer 12. Thus, the light is refracted and enters the solid-state light source 11.

As described above, the light-emitting device 10 of the present embodiment includes: the phosphor layer 12 provided on the light-emitting surface side of the solid-state light source 11 that emits excitation light and having the reflection film 14 on its side surface; and the low refractive layer 13 provided on the phosphor layer 12 and having the refractive index less than that of the phosphor layer 12. The upper surfaces and the side surfaces of the phosphor layer 12 and the low refractive layer 13 are covered with the sealing member 15 having the refractive index greater than or equal to the refractive index of the low refractive layer 13. Thus, the total reflection interface is formed at the interface between the phosphor layer 12 and the low refractive layer 13. The angle component of the fluorescent light reflected at the interface is enlarged to have the total reflection angle or less by self-absorption or self-light emission of the phosphor particles 121 or scattering by the scattering particles, and is extracted to the outside. Therefore, it is possible to improve the light extraction efficiency.

In the light-emitting device 10 of the present embodiment, the phosphor layer 12 in which the phosphor particles 121 and the scattering particles 122 are uniformly mixed is provided on the solid-state light source 11 to obtain R/G/B light emission. Because the fluorescent color obtained in such a manner is determined by the material and particle diameter of the phosphor particle 121 as described above, the fluorescent color is hardly changed even if the excitation light is changed in wavelength. Therefore, it is possible to cancel a change in wavelength of the excitation light source caused by current injection, and wavelength unevenness caused in the manufacturing process.

Furthermore, in view of light emission efficiency, typical LEDs including GaInN materials exhibit high light emission efficiency only in a limited emission wavelength range from 400 nm to 500 nm. Thus, the light emission efficiency is reduced by making the wavelength shorter or longer. In contrast, the light emitting layer of the present embodiment includes ultraviolet to blue GaInN-based LEDs with high efficiency. Accordingly, the efficiency is expected to be improved as compared with green LEDs. In addition, as described above, the efficiency of the LED including a GaInP material is remarkably lowered due to the reduction in the LED size. In contrast, forming the light-emitting layer using the GaInN-based LEDs makes it possible to reduce the size of the light source while maintaining the light emission efficiency of the red LEDs. That is, the light-emitting device 10 of the present embodiment is applicable to, for example, a typical LED having a size of about 300 μm. In particular, the light-emitting device 10 of the present embodiment is preferably used in a so-called micro-LED having a size of 1 μm or greater and 150 μm or less and an image display apparatus including the micro-LED.

Further, the light-emitting device 10 of the present embodiment makes it possible to obtain a light distribution close to the Lambertian light distribution.

To further improve the light emission efficiency, it is preferable to form a reflection film around the solid-state light source 11. The reflection film preferably has a material having a higher reflectance for excitation light and fluorescent light at any light incident angle. Specific examples of the material of the reflection film include gold (Au), silver (Ag), aluminum (Al), and platinum (Pt), for example. When LEDs are used as the solid-state light source 11, a metallic electrode material formed to inject current may be extended to serve as the reflection film.

Further, because the phosphor layer 12 is provided on the low refractive layer 13 in the light-emitting device 10 of the present embodiment, it is possible to use the sealing member 15 having a flat light-emitting surface. Compared with a typical light-emitting device provided with a dome-shaped sealing member, it is possible to reduce the size of the light-emitting device 10 and the size of the light-emitting unit 100 including a plurality of light-emitting devices 10. Therefore, it is possible to achieve the LED display with high resolution.

Next, second to fifth embodiments and a modification example are described. Components corresponding to those of the light-emitting device 10 of the first embodiment are denoted by the same reference numerals, and descriptions thereof are omitted.

2. SECOND EMBODIMENT

FIG. 9 schematically illustrates an exemplary cross-sectional configuration of a light-emitting device according to the second embodiment (light-emitting device 20) of the present disclosure. Similar to the light-emitting device 10 of the first embodiment, the light-emitting device 20 is preferably used as a display pixel of an image display apparatus (e.g., image display apparatus 1), which may be a so-called LED display, for example.

The light-emitting device 20 includes, in order, a phosphor layer 22 having the reflection film 14 on its side surface, and the low refractive layer 13 on the light emitting surface side of the solid-state light source 11. The phosphor layer 22 and the low refractive layer 13 are encapsulated in the sealing member 15. The phosphor layer 22 has the first refractive index (n1), and the low refractive layer 13 has the second refractive index (n2) less than the first refractive index. The sealing member 15 has the third refractive index (n3) greater than or equal to the second refractive index. The light-emitting device 20 of the present embodiment differs from the first embodiment described above in that the side surface of the phosphor layer 22 has a cone angle expanding from the solid-state light source 11 side toward the low refractive layer 13 side as illustrated in FIG. 10.

The phosphor layer 22 absorbs excitation light emitted from the solid-state light source 11 to emit fluorescent light, and has the first refractive index (n1). As illustrated in FIG. 2, for example, the phosphor layer 22 includes the plurality of phosphor particles 121 and the plurality of scattering particles 122 dispersed in the filler 123, for example. The phosphor layer 22 has a cone angle on the side surface as described above. The angle θc is preferably, for example, 30° or greater and less than 90° with respect to the light-emitting surface of the solid-state light source 11.

As described above, in the light-emitting device 20 of the present embodiment, the side surface of the phosphor layer 22 extends from the solid-state light source 11 side to the low refractive layer 13 side at a cone angle of 30° or greater and less than 90° with respect to the light-emitting surface of the solid-state light source 11. This makes it possible to further improve the light extraction efficiency.

3. THIRD EMBODIMENT

FIG. 11 schematically illustrates an exemplary cross-sectional configuration of a light-emitting device according to a third embodiment (light-emitting device 30) of the present disclosure. Similar to the light-emitting device 10 of the first embodiment, the light-emitting device 30 is preferably used as a display pixel of an image display apparatus (e.g., image display apparatus 1), which may be a so-called LED display, for example.

The light-emitting device 30 includes, in order, the phosphor layer 22 having the reflection film 14 on its side surface, and the low refractive layer 13 on the light emitting surface side of the solid-state light source 11. The phosphor layer 22 and the low refractive layer 13 are encapsulated in a sealing member 35. The phosphor layer 22 has the first refractive index (n1), and the low refractive layer 13 has the second refractive index (n2) less than the first refractive index. The sealing member 35 has the third refractive index (n3) greater than or equal to the second refractive index. The light-emitting device 30 of the present embodiment differs from the second embodiment described above in that the sealing member 35 provided above the low refractive layer 13 includes scattering particles 351.

If the side surface of the phosphor layer 22 has a cone angle as in the light-emitting device 20 of the second embodiment, the light extraction efficiency is improved, but the deviation from the Lambertian property may increase as the cone angle θc decreases.

To address this, in the present embodiment, the scattering particles 351 are included in the sealing member 35 provided above the low refractive layer 13. Accordingly, an effect is achieved that the Lambertian property is improved by the scattering particles 351 scattering fluorescent light emitted from the phosphor layer 22 as well as the effect of the second embodiment.

4. FOURTH EMBODIMENT

FIG. 12 schematically illustrates an exemplary cross-sectional configuration of a light-emitting device according to a fourth embodiment (light-emitting device 40A) of the present disclosure. FIG. 13 illustrates another exemplary cross-sectional configuration of a light-emitting device according to the present embodiment (light-emitting device 40B). Similar to the light-emitting device 10 of the first embodiment, the light-emitting devices 40A and 40B are preferably used as a display pixel of an image display apparatus (e.g., image display apparatus 1), which may be a so-called an LED display, for example. Hereinafter, the present embodiment will be described with reference to the light-emitting device 40A illustrated in FIG. 12.

The light-emitting device 40A includes, in order, the phosphor layer 12 having the reflection film 14 on its side surface, and the low refractive layer 13 on the light emitting surface side of the solid-state light source 11. The phosphor layer 12 and the low refractive layer 13 are encapsulated in the sealing member 15. The phosphor layer 12 has the first refractive index (n1), and the low refractive layer 13 has the second refractive index (n2) less than the first refractive index. The sealing member 15 has the third refractive index (n3) greater than or equal to the second refractive index. The light-emitting device 40A of the present embodiment differs from the first embodiment described above in that a reflection film 16 is provided on a side surface of the low refractive layer 13.

The reflection film 16 is provided on the side surface of the low refractive layer 13, and reflects excited light emitted from the solid-state light source 11 and scattered by the scattering particles 122 or fluorescent light emitted from the phosphor particle 121 into the low refractive layer 13, for example. It is preferable that the reflection film 16 be formed using a material having a high reflectance for excited light and fluorescent light at any light incident angle. Specific examples of the material of the reflection film 16 include gold (Au), silver (Ag), aluminum (Al), and platinum (Pt), for example.

As described above, the light-emitting device 40A of the present embodiment includes the reflection film 16 provided on the side surface of the low refractive layer 13.

In the light-emitting device 10 of the first embodiment, as illustrated in FIG. 8, for example, fluorescent light refracted at the interface between the phosphor layer 12 and the low refractive layer 13 and incident on the side surface of the low refractive layer 13 travels directly into the sealing member 15. The fluorescent light traveling from the side surface of the low refractive layer 13 into the sealing member 15 is incident at an angle greater than the total reflection angle with respect to an interface between the sealing member 15 and the outside, without being extracted to the outside.

In contrast, in the present embodiment in which the reflection film 16 is provided on the side surface of the low refractive layer 13, fluorescent light incident on the side surface of the low refractive layer 13 is reflected by the reflection film 16 provided on the side surface of the low refractive layer 13 into the low refractive layer 13, and is extracted from the upper surface (surface 51) of the sealing member 15, as illustrated in FIG. 12. That is, it is possible to further improve the light extraction efficiency.

It is to be noted that, as in the light-emitting device 40B illustrated in FIG. 13, the reflection film 16 may be provided on the side surface of the low refractive layer 13 of the light-emitting device 20 or 30 of the second embodiment or the third embodiment described above provided with the phosphor layer 22 having a cone angle expanding toward the low refractive layer 13 side. This makes it possible to further improve the light extraction efficiency.

5. FIFTH EMBODIMENT

FIG. 14 schematically illustrates an exemplary cross-sectional configuration of a light-emitting device according to a fifth embodiment (light-emitting device 50) of the present disclosure. Similar to the light-emitting device 10 of the first embodiment, the light-emitting device 50 is preferably used as a display pixel of an image display apparatus (e.g., image display apparatus 1), which may be a so-called an LED display, for example.

The light-emitting device 40A includes, in order, the phosphor layer 12 having the reflection film 14 on its side surface, and the low refractive layer 13 on the light-emitting surface side of the solid-state light source 11. The phosphor layer 12 and the low refractive layer 13 are encapsulated in the sealing member 15. The phosphor layer 12 has the first refractive index (n1), and the low refractive layer 13 has the second refractive index (n2) less than the first refractive index. The sealing member 15 has the third refractive index (n3) greater than or equal to the second refractive index. The light-emitting device 50 of the present embodiment differs from the first embodiment described above in that anti-reflection structures 17 and 18 are respectively provided at the interface between the phosphor layer 12 and the low refractive layer 13 and the interface between the low refractive layer 13 and the sealing member 15.

The anti-reflection structures 17 and 18 are for reducing reflection of the light having an angle less than or equal to a critical angle at the respective interfaces and to be extracted to the outside. The anti-reflection structure 17 may be formed, for example, by an anti-reflection film having a refractive index between the refractive index of the phosphor layer 12, i.e., the first refractive index (n1) and the refractive index of the low refractive layer 13, i.e., the second refractive index (n2) and a thickness of approximately ¼ wavelength. Alternatively, the anti-reflection structure 17 may be formed by a fine uneven structure of a scale of ½ wavelength or less. The anti-reflection structure 18 may be formed, for example, by an anti-reflection film having a refractive index between the refractive index of the low refractive layer 13, i.e., the second refractive index (n2) and the refractive index of the sealing member 15, i.e., the third refractive index (n3) and a thickness of approximately ¼ wavelength. Alternatively, the anti-reflection structure 18 may be formed by a fine uneven structure on a scale of ½ wavelength or less.

The fine uneven structure on the scale of ½ wavelengths or less may be formed by, for example, a so-called nano-imprinting technique that involves applying a resin onto the phosphor layer 12 (or the low refractive layer 13) and then embossing the resin using a mold having a predetermined shape.

As described above, the light-emitting device 50 of the present embodiment includes the anti-reflection structures 17 and 18 respectively provided at the interface between the phosphor layer 12 and the low refractive layer 13 and the interface between the low refractive layer 13 and the sealing member 15. This reduces the reflection of the light having an angle less than or equal to the critical angle at the interface between the phosphor layer 12 and the low refractive layer 13 and the interface between the low refractive layer 13 and the sealing member 15 and to be extracted to the outside. Therefore, it is possible to further improve the light extraction efficiency.

It is to be noted that the effects described above may be achieved by only either one of the anti-reflection structures 17 and 18; however, providing both of the anti-reflection structures 17 and 18 makes it possible to reduce the reflection of the light having an angle less than or equal to the critical angle at both of the interface between the phosphor layer 12 and the low refractive layer 13 and the interface between the low refractive layer 13 and the sealing member 15 and to be extracted to the outside. Therefore, it is possible to achieve a more significant effect.

6. MODIFICATION EXAMPLES

FIGS. 15 to 18 each schematically illustrate a cross-sectional configuration of a light-emitting unit (light-emitting units 100A to 100D) according to a modification example of the present disclosure.

In the light-emitting unit 100 according to the first embodiment, the solid-state light source 11 that emits ultraviolet light as excitation light is used. Alternatively, a solid-state light source 61 that emits light in the blue band may be used. In this case, the phosphor layer 12 of a light-emitting device 60B may be formed of, for example, the filler 123 in which only the scattering particles 122 are dispersed. Light-emitting devices 60 G and 60R have the same configuration as the light-emitting devices 10G and 10R except that the solid-state light source 11 emitting light in the blue band is used (FIG. 15, the light-emitting unit 100A).

Further, for the light-emitting unit 100 described above, the example is described in which the sealing member 15 is used to collectively cover the side surfaces and the upper surfaces of the phosphor layer 12 and the low refractive layer 13; however, the configuration of the sealing member 15 is not limited thereto. For example, as in the light-emitting unit 100B illustrated in FIG. 16, the sealing member 15 may have a three-layer structure including, in order, a sealing layer 15C covering the side surface of the phosphor layer 12, a sealing layer 15B covering the side surface of the low refractive layer 13, and a sealing layer 15A covering the upper surface of the low refractive layer 13 and the sealing layer 15C. Further, the sealing layer 15C covering the side surface of the phosphor layer 12 may also serve as the reflection film 14, as in the light-emitting unit 100C illustrated in FIG. 17. That is, the sealing layer 15C may be formed by, for example, a metal film, and provided with openings at positions corresponding to the light-emitting devices 10B, 10G, and 10R. The openings are filled with the phosphor particle 121, the scattering particles 122, and the filler 123 to form the phosphor layer 12. Still further, for the light-emitting device 10 and the light-emitting unit 100 described above, the example is described in which the reflection film 14 is provided only on the side surface of the phosphor layer 12; however, this is a non-limiting example. For example, the reflection film 14 may be provided so as to continuously extend on the side surfaces of the phosphor layer 12 and the low refractive layer 13, as in the light-emitting unit 100D illustrated in FIG. 18. In that case, as illustrated in FIG. 18, the sealing member 15 may have a two-layer structure including the sealing layer 15B covering the side surfaces of the phosphor layer 12 and the low refractive layer 13 and the sealing layer 15A covering the upper surface of the low refractive layer 13 and the sealing layer 15B.

7. WORKING EXAMPLES

An optical simulation was conducted to verify the efficiency in extracting fluorescent light of light-emitting devices each including the solid-state light source provided with the phosphor layer and sealed with the sealing member, including the example of the present disclosure.

(Simulation 1)

Table 1 summarizes the configurations of light-emitting devices subjected to the optical simulation (Experimental Examples 1 to 8). Experimental Example 1 is a light-emitting device in which a phosphor layer including a filler in which only phosphor particles are dispersed is provided on a solid-state light source, and is sealed with a sealing member. Experimental Example 2 is a light-emitting device in which a reflection film is added to a side surface of the phosphor layer of Experimental Example 1. Experimental Example 3 is a light-emitting device in which scattering particles are added to the phosphor layer of Experimental Example 1. Experimental Example 4 is a light-emitting device in which scattering particles are added to the phosphor layer of Experimental Example 1, and a reflection film is added to the side surface of the phosphor layer. Experimental Example 5 is a light-emitting device in which a low refractive layer is provided on the phosphor layer of Experimental Example 1. Experimental Example 6 is a light-emitting device in which a reflection film is added to the side surface of the phosphor layer of Experimental Example 1, and a low refractive layer is provided on the phosphor layer. Experimental Example 7 is a light-emitting device in which scattering particles are added to the phosphor layer of Experimental Example 1, and a low refractive layer is provided on the phosphor layer. Experimental Example 8 is a light-emitting device corresponding to the light-emitting device 10 described above in which a phosphor layer includes phosphor particles, scattering particles, and a filler, and a low refractive layer is provided on the phosphor layer. The side surface of each of the phosphor layers of Examples 1 to 8 has an angle of 90° with respect to the light-emitting surface of the solid-state light source 11.

TABLE 1

| | Configuration of light-emitting device | | | |
| --- | --- | --- | --- | --- |
| | Angle of side surface | Side-surface reflection film | Low-refractive layer | Scattering particle |
| Experimental Example 1 | 90° | — | — | — |
| Experimental Example 2 | 90° | ○ | — | — |
| Experimental Example 3 | 90° | — | — | ○ |
| Experimental Example 4 | 90° | ○ | — | ○ |
| Experimental Example 5 | 90° | — | ○ | — |
| Experimental Example 6 | 90° | ○ | ○ | — |
| Experimental Example 7 | 90° | — | ○ | ○ |
| Experimental Example 8 | 90° | ○ | ○ | ○ |

FIG. 19 illustrates the results of a simulation of the efficiency in extracting fluorescent light in Experimental Examples 1 to 8. FIG. 20 illustrates the results of a simulation of the amount of deviation of the fluorescent light distribution from the Lambertian (square root of the amount of deviation from the Lambertian light distribution) in Experimental Examples 1 to 8. In this simulation, the following parameters were used: the solid-state light source having a wavelength of 405 nm, the fluorescent particle having a fluorescent light wavelength of 530 nm, the fluorescent particle having an inner quantum efficiency of 80%, the side-surface reflection film having a reflectance of 90%, n1=1.5 (average value corresponding to acrylic resin), n2=1.0, n3=1.5 (average value corresponding to acrylic resin), n=1.0 for the air layer, and the scattering particle having a refractive index of 2.0.

The simulation results indicate that the efficiency in extracting fluorescent light of Experimental Example 1 was 4.9%, whereas the efficiency in extracting fluorescent light of Experimental Example 5 including the low refractive layer provided on the phosphor layer was 4.6%, which was almost the same as the efficiency of Experimental Example 1. This demonstrates that simply providing the low refractive layer on the phosphor layer does not improve the extraction efficiency and the Lambertian property.

The results of Experimental Example 1 and Experimental Example 5 are described with reference to FIGS. 21 and 22. FIG. 21 illustrates the ray profile in the case of n1=n3 in a simple manner. Note that n1 and n3 are not necessarily the same. In Experimental Example 1, a phosphor layer 1012 and a sealing member 1015 have the same refractive index. Thus, as illustrated in FIG. 21, fluorescent light emitted from the phosphor particle is incident on the sealing member 1015 without refracting or reflecting, and only the fluorescent light having an reflection angle less than or equal to the total reflection angle at an interface between the sealing member 1015 and an air layer is extracted to the outside. In contrast, in Experimental Example 5, fluorescent light emitted from the phosphor particle generates a light beam satisfying the total-reflection condition at the interface between the phosphor layer 1012 and a low refractive layer 1013 as illustrated in FIG. 22. The fluorescent light having an angle component less than or equal to the total reflection angle enters the low refractive layer 1013, passes through the sealing member 1015 as it is, and is extracted to the air-layer (outside).

On the other hand, the fluorescent light having an angle component greater than or equal to the total reflection angle at the interface between the phosphor layer 1012 and the low refractive layer 1013 is reflected by the phosphor layer 1012. This fluorescent light leaks from the side surface of the phosphor layer 1012 to the outside without being extracted from the upper surface of the sealing member 1015 to the outside. In a case where the phosphor particle is present, fluorescent light is emitted due to the self-absorption, and components less than or equal to the total reflection angle out of the fluorescent components are extracted to the outside. However, there is no large difference from Experimental Example 1, and therefore, it is presumed that the efficiency in extracting fluorescent light was not changed.

In contrast, the efficiency in extracting fluorescent light of Experimental Example 8 was improved to 11.0%. As illustrated in FIG. 8, fluorescent light emitted from the phosphor particle satisfies the total reflection at the interface between the phosphor layer 12 and the low refractive layer 13, and the fluorescent components less than or equal to the total reflection angle are directly transmitted through the low refractive layer 13 and the sealing member 15 and extracted to the air layer (outside). The light greater than or equal to the total reflection angle is reflected at the interface between the phosphor layer 12 and the low refractive layer 13, and returns to the phosphor layer 12. The fluorescent light reflected at the interface between the phosphor layer 12 and the low refractive layer 13 reaches the side surface of the phosphor layer 12 as illustrated in FIG. 8, but is reflected by the reflection film 14 into the phosphor layer 12 without leaking to the outside. In the process of repeating this reflection, the components having the total reflection angle or less are formed by the self-absorption/light emission of the phosphor particle or scattering by the scattering particle, and are extracted to the outside in time.

Further, as illustrated in FIG. 21, in a case where the total reflection interface (the interface between the sealing member 1015 and the air-layer) is separated, the fluorescent light totally reflected becomes ineffective light without being extracted. In contrast, in Experimental Example 8, the fluorescent light is totally reflected immediately above the phosphor layer 12 (the interface between the phosphor layer 12 and the low refractive layer 13), as illustrated in FIG. 8. Thus, the fluorescent light reflected may be converted into fluorescent light having the total reflection angle or less in the phosphor layer 12 again. Accordingly, it is presumed that the efficiency in extracting fluorescence was improved. Further, the efficiency in recycling light is improved by providing the reflection film 14 on the side surface of the phosphor layer 12.

(Simulation 2)

Table 2 summarizes the configurations of light-emitting devices subjected to the optical simulation (Experimental Examples 9 to 16). Experimental Example 9 is a light-emitting device in which a phosphor layer including a filler in which only phosphor particles are dispersed and having a side surface with a cone angle of 80° is provided on a solid-state light source. Experimental Example 10 is a light-emitting device in which the phosphor layer of Experimental Example 9 having a side surface with a cone angle of 45° is prepared. Experimental Example 11 is a light-emitting device in which scattering particles are added to the phosphor layer of Experimental Example 9. Experimental Example 12 is a light-emitting device in which scattering particles are added to the phosphor layer of Experimental Example 10. Experimental Example 13 is a light-emitting device in which a low refractive layer is provided on the phosphor layer of Experimental Example 9. Experimental Example 14 is a light-emitting device in which a low refractive layer is provided on the phosphor layer of Experimental Example 10. Experimental Example 15 is a light-emitting device corresponding to the light-emitting device 20 described above in which a phosphor layer includes phosphor particles, scattering particles, and a filler, and a low refractive layer is provided on the phosphor layer having a side surface with a cone angle of 80°. Experimental Example 16 is a light-emitting device corresponding to the light-emitting device 20 described above in which a phosphor layer includes phosphor particles, scattering particles, and a filler, and a low refractive layer is provided on the phosphor layer having a side surface with a cone angle of 45°. The side surface of the phosphor layers of Experimental Examples 9 to 16 are all provided with a reflection film.

TABLE 2

| | Configuration of light-emitting device | | | |
| --- | --- | --- | --- | --- |
| | Angle of side surface | Side-surface reflection film | Low-refractive layer | Scattering particle |
| Experimental Example 9 | 80° | ○ | — | — |
| Experimental Example 10 | 45° | ○ | — | — |
| Experimental Example 11 | 80° | ○ | — | ○ |
| Experimental Example 12 | 45° | ○ | — | ○ |

TABLE 2-continued

| | Configuration of light-emitting device | | | |
|---|---|---|---|---|
| | Angle of side surface | Side-surface reflection film | Low-refractive layer | Scattering particle |
| Experimental Example 13 | 80° | ○ | ○ | — |
| Experimental Example 14 | 45° | ○ | ○ | — |
| Experimental Example 15 | 80° | ○ | ○ | ○ |
| Experimental Example 16 | 45° | ○ | ○ | ○ |

FIG. 23 illustrates the results of the simulation of the efficiency in extracting fluorescent light in Experimental Examples 9 to 16 together with the results of Experimental Examples 2, 4, and 6. FIG. 24 illustrates the results of the simulation of the amount of deviation of the fluorescent light distribution from the Lambertian (square root of the amount of deviation from the Lambertian light distribution) in Experimental Examples 9 to 16 together with the results of Experimental Examples 2, 4, and 6. In this simulation, the following parameters were used: the solid-state light source having a wavelength of 405 nm, the fluorescent particles having a fluorescent light wavelength of 530 nm, the fluorescent particles having an inner quantum efficiency of 80%, the reflection film on the side surface having a reflectance of 90%, n1=1.5 (average value corresponding to acrylic resin), n2=1.0, n3=1.5 (average value corresponding to acrylic resin), n=1.0 for the air layer, and the scattering particle having a refractive index of 2.0.

The simulation results indicate that the efficiency in extracting fluorescent light of Experimental Examples 6, 15, and 16 were 11.0%, 12.8%, and 18.7%, respectively, and that the efficiency in extracting fluorescent light increased as the cone angle θc of the side surface of the phosphor layer 12 became closer to 45°. Note that the simulation results also indicate that the efficiency in extracting fluorescent light was improved, whereas the amount of deviation of the extracted light from the Lambertian property was increased, as the cone angle θc of the side surface of the phosphor layer 12 decreased. In specific, an estimated amount of deviation of FFP from the Lambertian property was 0.038 at θc=90°, 0.036 at θc=80°, and 0.110 at θc=45°. That is, the amount of deviation became small at θc=80°, whereas the amount of deviation remarkably increased at θc=45°. In addition, the light-emitting device increases in size as the tilt angle becomes smaller.

The present disclosure has been described above with reference to the first to fifth embodiments, the modification example, and the working examples. It is to be noted that the present disclosure is not limited to the embodiments described above, and various modifications may be made. For example, in the embodiments and the like described above, the side surface of the phosphor layer 12 has a planar shape; however, the surface side of the phosphor layer 12 may have a curved shape, for example.

In the first embodiment, an example in which the light-emitting unit 100 includes the three light-emitting devices 10R, 10G, and 10B arranged in a line is described. However, this is a non-limiting example. For example, the light-emitting devices 10R, 10G, and 10B may be arranged in a triangular shape.

Further, the configurations described in the first to fifth embodiments may be combined as appropriate. For example, the fourth embodiment and the fifth embodiment may be combined, so that the reflection films 14 and 16 are provided on the side surfaces of the phosphor layer 12 and the low refractive layer 13, respectively, and the anti-reflection structures 17 and 18 are provided on the interface between the phosphor layer 12 and the low refractive layer 13 and the interface between the low refractive layer 13 and the sealing member 15, respectively. Still further, the second embodiment may be combined, so that the side surface of the phosphor layer 12 has a tapered shape. Alternatively, the third embodiment may be combined, so that the scattering particles 351 are provided above the low refractive layer 13 of the sealing member 15. In this way, it is possible to improve the Lambertian property while further improving the efficiency in extracting light.

It is to be noted that the effects described herein are merely illustrative and not restrictive, and other effects may be achieved.

Note that the present disclosure may also be configured as follows. According to the present technology having the following configuration, the phosphor layer having the first refractive index is provided with a first reflection film on its side surface; the low refractive layer having a second refractive index less than the first refractive index is provided on the phosphor layer; and the phosphor layer and the low refractive layer are covered with the sealing member having the third refractive index greater than or equal to the second refractive index. Accordingly, the total reflection interface is formed at the interface between the phosphor layer and the low refractive layer. Fluorescent light reflected at the interface is converted into fluorescent light having the total reflection angle or less in the phosphor layer again. Accordingly, it is possible to improve the utilization efficiency of excitation light and the efficiency in extracting fluorescence light.

(1) A light-emitting device including:
a solid-state light source emitting excitation light;
a phosphor layer having a first refractive index, provided on a light-emitting surface side of the solid-state light source, and having a first reflection film on its side surface;
a low refractive layer provided on the phosphor layer and having a second refractive index less than the first refractive index; and
a sealing member encapsulating the phosphor layer and the low refractive layer and having a third refractive index greater than or equal to the second refractive index.

(2) The light-emitting device according to (1) described above, in which the phosphor layer includes a scattering particle.

(3) The light-emitting device according to (1) or (2) described above, in which the phosphor layer includes a plurality of the scattering particles, and the scattering particles are dielectric substances having a mean particle diameter of 100 nm or greater and 1000 nm or less.

(4) The light-emitting device according to (2) or (3) described above, in which the light-emitting device includes at least one of silicon oxide ($SiO_2$), titanium oxide ($TiO_2$), aluminum oxide ($Al_2O_3$), aluminum nitride (AlN), boron nitride (BN), or zinc oxide (ZnO).

(5) The light-emitting device according to any one of (2) to (4) described above, in which the phosphor layer includes a filler in which a phosphor particle and the scattering particle are dispersed.

(6) The light-emitting device according to any one of (1) to (5) described above, in which the side surface of the phosphor layer has a cone angle making a cross-sectional surface of the phosphor layer expand from the solid-state light source towards the low refractive layer.

(7) The light-emitting device according to (6) described above, in which the cone angle of the side surface of the phosphor layer is 30° or greater and less than 90°.

(8) The light-emitting device according to any one of (1) to (7) described above, in which the sealing member includes a scattering particle above the low refractive layer.

(9) The light-emitting device according to any one of (1) to (8) described above, wherein the low refractive layer further includes a second reflection film on its side surface.

(10) The light-emitting device according to any one of (1) to (9) described above, further including a first anti-reflection structure at an interface between the phosphor layer and the low refractive layer.

(11) The light-emitting device according to (10) described above, in which the first anti-reflection structure includes an anti-reflective film having a refractive index between the refractive index of the phosphor layer and the refractive index of the low refractive layer and having a thickness of approximately ¼ wavelength.

(12) The light-emitting device according to (10) described above, in which the first anti-reflection structure includes a fine uneven structure on a scale of ½ wavelength or less.

(13) The light-emitting device according to any one of (1) to (12) described above, further including a second anti-reflection structure at an interface between the low refractive layer and the sealing member.

(14) The light-emitting device according to (13) described above, in which the second anti-reflection structure includes an anti-reflective film having a refractive index between the refractive index of the low refractive layer and the refractive index of the sealing member and having a thickness of approximately ¼ wavelength.

(15) The light-emitting device according to (13) described above, in which the second anti-reflection structure includes a fine uneven structure on a scale of ½ wavelength or less.

(16) The light-emitting device according to any one of (1) to (15) described above, in which the phosphor layer includes a quantum-dot phosphor as a phosphor particle.

(17) The light-emitting device according to (16) described above, in which the quantum-dot phosphor includes a core portion and a shell layer covering the core portion.

(18) The light-emitting device according to any one of (1) to (17) described above, in which the solid-state light source includes a light-emitting diode having an emission wavelength in a blue region or an ultraviolet region.

(19) An image display apparatus including a plurality of light-emitting devices, the light-emitting devices each including:
  a solid-state light source emitting excitation light;
  a phosphor layer having a first refractive index, provided on a light-emitting surface side of the solid-state light source, and having a first reflection film on its side surface;
  a low refractive layer provided on the phosphor layer and having a second refractive index less than the first refractive index; and
  a sealing member encapsulating the phosphor layer and the low refractive layer and having a third refractive index greater than or equal to the second refractive index.

The present application claims priority based on Japanese Patent Application No. 2018-1924120 filed with the Japan Patent Office on Oct. 15, 2018, the entire contents of which are incorporated herein by reference.

It should be understood that those skilled in the art would make various modifications, combinations, sub-combinations, and alterations depending on design requirements and other factors, and they are within the scope of the attached claims or the equivalents thereof.

The invention claimed is:

1. A light-emitting device, comprising:
  a solid-state light source configured to emit excitation light;
  a phosphor layer having a first refractive index, wherein
    the phosphor layer is on a light-emitting surface side of the solid-state light source, and
    the phosphor layer includes a first reflection film on a first side surface of the phosphor layer;
  a low refractive layer on the phosphor layer, wherein the low refractive layer has a second refractive index less than the first refractive index;
  a first anti-reflection structure at an interface between the phosphor layer and the low refractive layer; and
  a sealing member that encapsulates the phosphor layer and the low refractive layer, wherein the sealing member has a third refractive index greater than or equal to the second refractive index.

2. The light-emitting device according to claim 1, wherein the phosphor layer further includes a scattering particle.

3. The light-emitting device according to claim 2, wherein
  the phosphor layer further includes a plurality of scattering particles,
  the plurality of scattering particles includes the scattering particle, and
  the plurality of scattering particles corresponds to dielectric substances having a mean particle diameter of 100 nm or greater and 1000 nm or less.

4. The light-emitting device according to claim 2, wherein a material of the scattering particle comprises at least one of silicon oxide ($SiO_2$), titanium oxide ($TiO_2$), aluminum oxide ($Al_2O_3$), zirconium oxide ($ZrO_2$), aluminum nitride (AlN), boron nitride (BN), or zinc oxide (ZnO).

5. The light-emitting device according to claim 2, wherein the phosphor layer further includes a filler in which a phosphor particle and the scattering particle are dispersed.

6. The light-emitting device according to claim 1, wherein the first side surface of the phosphor layer has a cone angle making a cross-sectional surface of the phosphor layer expand from the solid-state light source towards the low refractive layer.

7. The light-emitting device according to claim 6, wherein the cone angle of the first side surface of the phosphor layer is 30° or greater and less than 90°.

8. The light-emitting device according to claim 1, wherein
  the sealing member includes a scattering particle, and
  the sealing member is above the low refractive layer.

9. The light-emitting device according to claim 1, wherein the low refractive layer includes a second reflection film on a second side surface of the low refractive layer.

10. The light-emitting device according to claim 1, wherein
  the first anti-reflection structure comprises an anti-reflective film having a fourth refractive index between the first refractive index of the phosphor layer and the second refractive index of the low refractive layer, and
  the anti-reflective film has a thickness of approximately ¼ wavelength.

11. The light-emitting device according to claim 1, wherein the first anti-reflection structure comprises a fine uneven structure on a scale of ½ wavelength or less.

12. The light-emitting device according to claim 1, further comprising a second anti-reflection structure at an interface between the low refractive layer and the sealing member.

13. The light-emitting device according to claim 12, wherein
the second anti-reflection structure comprises an anti-reflective film having a fourth refractive index between the second refractive index of the low refractive layer and the third refractive index of the sealing member, and
the anti-reflective film has a thickness of approximately ¼ wavelength.

14. The light-emitting device according to claim 12, wherein the second anti-reflection structure comprises a fine uneven structure on a scale of ½ wavelength or less.

15. The light-emitting device according to claim 1, wherein the phosphor layer further includes a quantum-dot phosphor as a phosphor particle.

16. The light-emitting device according to claim 15, wherein
the quantum-dot phosphor includes a core portion and a shell layer, and
the shell layer covers the core portion.

17. The light-emitting device according to claim 1, wherein the solid-state light source comprises a light-emitting diode having an emission wavelength in one of a blue region or an ultraviolet region.

18. An image display apparatus, comprising,
a plurality of light-emitting devices, wherein each of the plurality of light-emitting devices includes:
a solid-state light source configured to emit excitation light;
a phosphor layer having a first refractive index, wherein
the phosphor layer is on a light-emitting surface side of the solid-state light source, and
the phosphor layer includes a first reflection film on a side surface of the phosphor layer;
a low refractive layer on the phosphor layer, wherein the low refractive layer has a second refractive index less than the first refractive index;
an anti-reflection structure at an interface between the phosphor layer and the low refractive layer; and
a sealing member that encapsulates the phosphor layer and the low refractive layer, wherein the sealing member has a third refractive index greater than or equal to the second refractive index.

19. A light-emitting device, comprising:
a solid-state light source configured to emit excitation light;
a phosphor layer having a first refractive index, wherein
the phosphor layer is on a light-emitting surface side of the solid-state light source, and
the phosphor layer includes a reflection film on a side surface of the phosphor layer;
a low refractive layer on the phosphor layer, wherein the low refractive layer has a second refractive index less than the first refractive index;
a sealing member that encapsulates the phosphor layer and the low refractive layer, wherein the sealing member has a third refractive index greater than or equal to the second refractive index; and
an anti-reflection structure at an interface between the low refractive layer and the sealing member.

* * * * *